(12) United States Patent
Maeda et al.

(10) Patent No.: US 6,204,536 B1
(45) Date of Patent: Mar. 20, 2001

(54) SEMICONDUCTOR DEVICE AND MANUFACTURING METHOD THEREOF

(75) Inventors: Shigenobu Maeda; Yuuichi Hirano, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/061,249

(22) Filed: Apr. 17, 1998

(30) Foreign Application Priority Data

Oct. 22, 1997 (JP) .................................................. 9-289641

(51) Int. Cl.[7] .................................................. H01L 23/62
(52) U.S. Cl. ............................................ 257/355; 257/630
(58) Field of Search ...................................... 257/355, 630

(56) References Cited

U.S. PATENT DOCUMENTS 5,428,232 6/1995 Hika et al. ............................ 257/256

FOREIGN PATENT DOCUMENTS

| 44 10 978 | 10/1994 | (DE) . |
| 0 361 121 | 4/1990 | (EP) . |
| 0 656 659 | 6/1995 | (EP) . |
| 0 772 238 | 5/1997 | (EP) . |

*Primary Examiner*—Mark V. Prenty
(74) *Attorney, Agent, or Firm*—Oblon, Spivak, McClelland, Maier & Neustadt, P.C.

(57) ABSTRACT

Provided is a semiconductor device with a silicide protection structure that prevents the over-etching of a source/drain layer in forming a contact hole and prevents a voltage drop in surge voltage without increasing the area of the source/drain layer, as well as a manufacturing method of the device. There is defined an active region (AR) of an MOS transistor and a gate electrode (10) that constitutes a field-shield isolation structure is formed in a rectangular loop shape. Over the FS gate electrode (10) and the active region (AR), a gate electrode (20) of the MOS transistor is formed so as to divide the FS gate electrode (10) into two. Each of active regions (AR) facing with each other across the gate electrode (20) has a silicide protection structure (PS1), whose surrounding is an S/D layer (30), and a silicide film (SF1) is formed over the structure (PS1).

10 Claims, 19 Drawing Sheets

F I G. 2 0
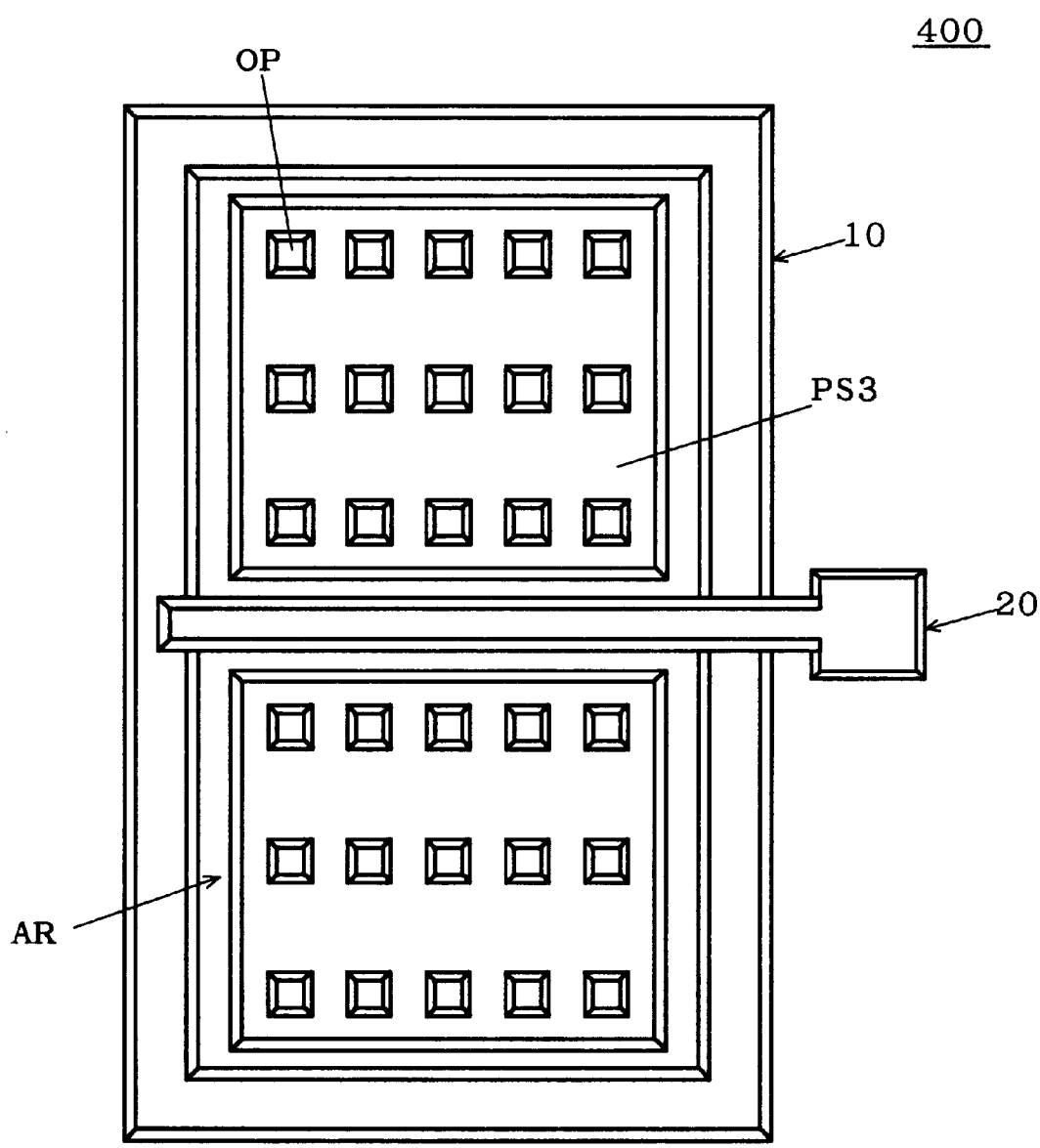

F I G. 2 1
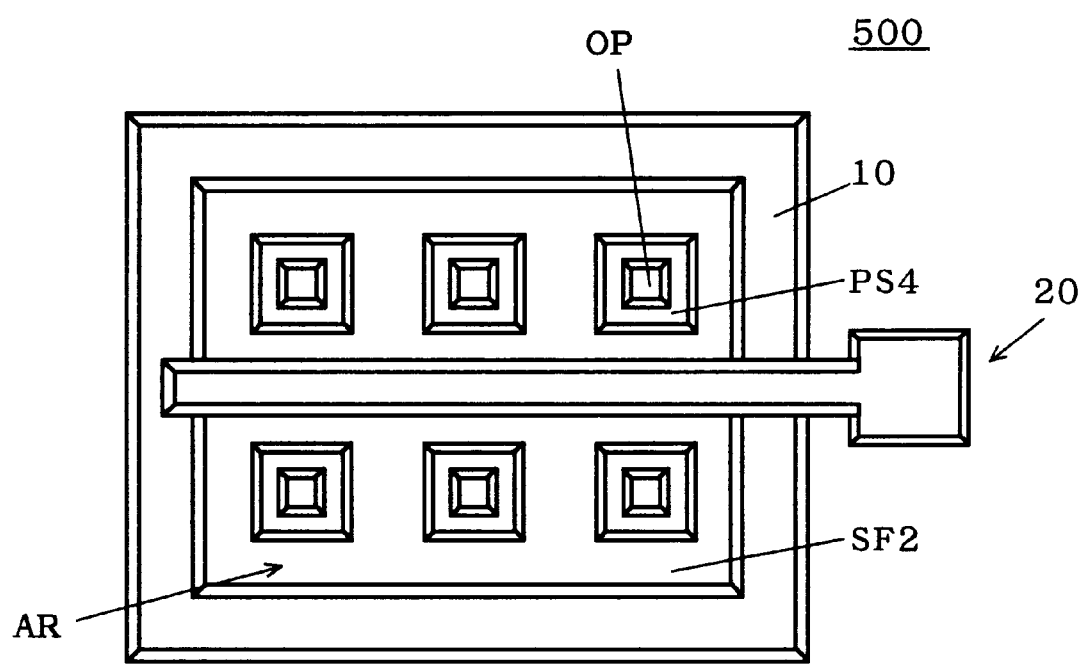

SEMICONDUCTOR DEVICE AND MANUFACTURING METHOD THEREOF

BACKGROUND OF THE INVENTION

1. Field of the Invention

The present invention relates to semiconductor devices and their manufacturing method. In particular, the present invention relates to MOS transistors requiring silicide protection and their manufacturing method.

2. Description of the Background Art

In transistors used for logic LSI (large-scale integrated circuit), the reduction in the parasitic resistance of source and drain regions and the wiring resistance of a polysilicon gate electrode at the same time is effected by Salicide (self-aligned silicide) technology in which a silicide film is selectively formed in a self-aligned manner on the surfaces of a source/drain layer and a polysilicon gate electrode.

Silicide film have the advantage of reducing the parasitic resistance and wiring resistance, however, in some cases the presence of silicide film causes an unfavorable phenomenon. To avoid such a phenomenon, portion whereat formation of silicide film is not desirable is protected by a silicide protection film that prevents a silicide film formation.

The problem in forming silicide film and silicide protection film is discussed herebelow. As an example of semiconductor integrated circuits, an inverter circuit C2 and a protection circuit C1 protecting it are shown in FIG. 35.

In the protection circuit C1, a P channel MOS transistor P1 and an N channel MOS transistor N1 are connected in series and an input pad PD is connected to a node ND1 connecting the transistors P1 and N1. The gate electrode of the transistor P1 is connected to a power supply potential (Vcc) and is normally in OFF state. The gate electrode of the transistor N1 is connected to a ground potential and is normally in OFF state.

In the inverter circuit C2, a P channel MOS transistor P2 and an N channel MOS transistor N2 are connected in series and a node ND2 connecting the transistors P2 and N2 is connected to another circuit (not shown). The gate electrodes of the transistors P2 and N2 are connected to the node ND1 of the protection circuit C1.

Here, suppose a surge voltage is inputted through the input pad PD, i.e., where ESD (Electro Static Discharge) occurs. The surge voltage is far higher than the operating voltages of normal MOS transistors. Therefore, in the absence of the protection circuit C1, the surge voltage will be applied to the gate electrodes of the P channel MOS transistor P2 and the N channel MOS transistor N2 in the inverter circuit C2 to possibly dielectric breakdown of both the gate insulatings. However, when a surge voltage is applied, the presence of the protection circuit C1 causes a breakdown between the source and drain of the transistors P1 and N1 so that the current flows, which prevent the surge voltage being applied to the inverter circuit C2.

However, when a very large surge voltage is applied to between the source and drain in the protection circuit C1, the P channel MOS transistor P1 or the N channel MOS transistor N1 in the circuit C1 will be destroy. The surge voltage at this time of destroy is called as ESD resistance, and it is desirable to design its value as large as possible. But if a silicide film is formed on the surface of the source and drain layer, the ESD resistance might be lowered.

FIG. 36 shows a plane construction of an MOS transistor M1. The MOS transistor M1 comprises a slender gate electrode GE provided in the center, and a source/drain layer SD on its both sides in the shorter direction, and a suicide film SF formed on the surface of the source/drain layer SD.

FIG. 37 is an enlarged view of the area A of FIG. 36. Generally, the silicide film SF is polycristal construction and comprises large and small silicide crystal grains GR, as shown in FIG. 37. Accordingly, each grain shape is reflected in the grain boundaries to exhibit corrugations. This is true for the edge portion of the silicide film SF along with the edge portion of the gate electrode GE. As shown in FIG. 37, crystal grains GR face one another across the gate electrode GE. When a surge voltage is applied to such a structure, the surge current is concentrated between the projections (i.e., space indicated by two arrows in opposite directions) of the crystal grains GR on both sides of the gate electrode GE and, in such portions, the intensive breakage occurs. This makes the MOS transistor inoperative, failing to function as a protection circuit. For this reason, silicide film in not formed on the surface of the source/drain layer in the protection circuit, and a silicide protection film is formed instead.

With reference to FIG. 38, the construction of an MOS transistor M2 with a silicide protection film is described herebelow.

As shown in FIG. 38, a silicide protection film SP comprising a silicon oxide film ($SiO_2$) is formed on the surfaces of a gate electrode GE and of a source/drain layer SD in the vicinity of the gate electrode GE while no silicide film SF is formed over the silicide protection film SP. This construction allows to increase the distance between the edge of the silicide film SF and the edge of the gate electrode GE. Even if the edge of the suicide film SF is in the shape of a continuous corrugation and hence a surge voltage tends to concentrate on projected portions, the surge current will be dispersed because it must pass a long distance through a lightly doped drain region (not shown) and a source/drain layer. Still further, when it passes through the lightly doped drain region having a relatively high resistance, a voltage drop and the like occur and thus prevents the MOS transistor from being broken.

As described above, the silicide protection film SP has been used to protect a silicide film SF formation in MOS transistors in which its formation can cause disadvantages.

In the formation of a silicide protection film SP, a silicon oxide film is formed over the entire surface of a silicon substrate SB and the silicon oxide film is then selectively removed by dry etching, such as RIE (Reactive Ion Etching), to form the silicide protection film SP only on the surfaces of a gate electrode GE and of a source/drain layer SD in the vicinity of the gate electrode GE.

Referring to FIGS. 39 and 40 that are a cross-sectional view of a MOS transistor at a processing step subsequent to the silicide protection film SP formation, the problems resulting from the formation of the silicide protection film are discussed herein.

With reference to FIG. 39, over an SOI substrate SI, there are a protection region PR in which a plurality of MOS transistors M1 requiring a silicide protection film will be formed and a normal region OR in which a plurality of MOS transistors M2 requiring no silicide protection film will be formed. The SOI substrate SI comprises a silicon substrate SB, a buried insulating layer BO, and an SOI layer SL, which are formed in this order on the substrate SB.

In the normal region OR a silicide film SF is formed over a source/drain layer SD2 and a gate electrode GE2, whereas in the protection region PR a silicide protection film SP of oxide film is formed over the entire surface and there are no silicide film SF over a source/drain layer SD1 and a gate electrode GE1.

After forming the silicide film SF and the silicide protection film SP, an interlayer insulating film IZ is formed over the SOI substrate SI. Thereafter, as shown in FIG. 40, contact holes CH1 and CH2 are formed so as extends through the interlayer insulating film IZ to reach the source/drain layers SD1 and SD2, respectively.

The problem at this time is that the selective ratio of etching differs between the silicide film SF and the silicide protection film SP. That is, since the silicide protection film SP being oxide film is more easily etched than the silicide film SF, if formed the contact holes CH1 and CH2 at the same time, the contact hole CH1 results in somewhat over-etching or in some cases it extends through the SOI layer to reach the buried insulating layer BO, failing to function as an MOS transistor.

As described earlier, to avoid the breakdown of MOS transistors by a surge voltage, a voltage drop due to a high resistance layer, e.g., a lightly doped drain layer, is effective. However, almost all part beneath the silicide protection film SP arc occupied by the source/drain layer and even the source/drain layer SD1 on which no silicide film SF is present has a sheet resistance of about several hundred $\Omega/\square$. In order to expect a voltage drop in surge voltage, it is therefore necessary to form a source/drain layer SD1 that is covered with a silicide protection film SP over a wide area. This is negative toward device downsizing.

SUMMARY OF THE INVENTION

According to a first aspect of the present invention, a semiconductor device comprising an MOS transistor formed on a semiconductor substrate is characterized in that: the MOS transistor comprises at least one silicide protection structure for preventing a suicide film formation in a predetermined portion on a surface of an active region outward side faces of a gate electrode; a first semiconductor layer of a first concentration is provided in a surface of the semiconductor substrate beneath the aforementioned at least one silicide protection structure; a second semiconductor layer of a second concentration is provided in a surface of the semiconductor substrate excluding a portion in which the aforementioned at least one silicide protection structure is formed; the suicide film is provided on the second semiconductor layer; the second semiconductor layer is a source/drain layer of the MOS transistor; and the first concentration is lower than the second concentration.

According to a second aspect of the present invention, at least one silicide protection structure is composed of an insulating film; and the first semiconductor layer is a semiconductor layer of a conductivity type opposite to that of the source/drain layer.

According to a third aspect of the present invention, at least one silicide protection structure is composed of an insulating film; and the first semiconductor layer is a semiconductor layer having a conductivity type identical with that of the source/drain layer.

According to a fourth aspect of the present invention, a field shield gate electrode defining the active region and electrically isolating the MOS transistor from other semiconductor elements, provided on the semiconductor substrate, wherein the field shield gate electrode has a field shield insulating film, a conductor layer, and a conductor layer upper insulating film, which are laminated in this order on the semiconductor substrate; a sidewall insulating film is provided on side faces of the field shield insulating film, the conductor layer, and the conductor layer upper insulating film; and the insulating film of the aforementioned at least one silicide protection structure and the sidewall insulating film are formed simultaneously with an identical material.

According to a fifth aspect of the present invention, a field shield gate electrode defining the active region and electrically isolating the MOS transistor from other semiconductor elements, provided on the semiconductor substrate, wherein the field shield gate electrode has a field shield insulating film, a conductor layer, and a conductor layer upper insulating film, which are laminated in this order on the semiconductor substrate; the aforementioned at least one silicide protection structure and the field shield gate electrode are formed simultaneously with an identical material; and the first semiconductor layer is a semiconductor layer having a conductivity type identical with that of the source/drain layer of the MOS transistor.

According to a sixth aspect of the present invention, at least one silicide protection structure and the gate electrode of the MOS transistor are formed simultaneously with an identical construction; and the first semiconductor layer is a semiconductor layer having a conductivity type identical with that of the source/drain layer of the MOS transistor.

According to a seventh aspect of the present invention, at least one silicide protection structure partially includes at least one opening portion whose bottom is composed of the silicide film; and the second semiconductor layer is provided a surface of the active region beneath the silicide film of the aforementioned at least one opening portion.

According to an eighth aspect of the present invention, at least one silicide protection structure is in a slender shape in plan view; the aforementioned at least one opening portion is a plural and are arranged in a row in a longitudinal direction of the aforementioned at least one suicide protection structure; and a longitudinal direction of the aforementioned at least one suicide protection structure is parallel to a longitudinal direction of the gate electrode.

According to a ninth aspect of the present invention, at least one suicide protection structure is a plural; and the plural opening portions are arranged at an interval so that they are in parallel to a longitudinal direction of the gate electrode.

According to a tenth aspect of the present invention, at least one silicide protection structure is a plural and each shape in plan view is approximately rectangle; the aforementioned at least one opening portion is a singular; and the plural silicide protection structures are arranged at least in parallel to a longitudinal direction of the gate electrode.

According to an eleventh aspect of the present invention, the plural silicide protection structures are arranged in a longitudinal direction of the gate electrode and in a direction vertical to the longitudinal direction of the gate electrode.

According to a twelfth aspect of the present invention, at least one silicide protection structure has an approximately rectangular shape in plan view; the aforementioned at least one opening portion is a plural; and the plural opening portions are arranged in a direction parallel to a longitudinal direction of the gate electrode and in a direction vertical to the longitudinal direction of the gate electrode.

According to a thirteenth aspect of the present invention, a manufacturing method of a semiconductor device comprising a field shield gate electrode that defines an MOS transistor formed on a semiconductor substrate and an active region outward of side faces of a gate electrode of the MOS transistor and isolates electrically the MOS transistor from other semiconductor elements, comprises the steps of: (a) selectively forming a first semiconductor layer of a first concentration in a predetermined portion of the semiconductor substrate; (b) to define the active region, selectively laminating a field shield insulating film, a conductor layer and a conductor layer upper insulating film on the semiconductor substrate, to form the field shield gate electrode, and selectively forming a silicide protection structure having an identical construction as the field shield gate electrode on the first semiconductor layer; (c) forming the gate electrode on the semiconductor substrate and performing an ion implantation of impurity by using the field shield gate electrode, the silicide protection structure, and the gate electrode, as masks, to form a second semiconductor layer of a second concentration within the semiconductor substrate; and (d) forming a silicide film in a self aligned manner on the second semiconductor layer by a salicide process, wherein the first concentration is lower than the second concentration; the second semiconductor layer is formed as a source/drain layer of the MOS transistor; and the first semiconductor layer is formed so that it has a conductivity type identical with that of the source/drain layer.

According to a fourteenth aspect of the present invention, the step (b) includes the step of forming the silicide protection structure so as to have an opening portion, at a bottom of which the first semiconductor layer is exposed; the method further comprising the step, prior to the step (c), of forming a sidewall insulating film on side faces of the suicide protection structure and the field shield gate electrode; wherein the sidewall insulating film is also formed on side faces of the conductor layer in the opening portion; and the step (c) includes the step of forming the second semiconductor layer within the first semiconductor layer of the opening portion bottom.

According to a fifteenth aspect of the present invention, a manufacturing method of a semiconductor device having an MOS transistor formed on a semiconductor substrate, comprises the steps of: (a) selectively forming a first semiconductor layer of a first concentration in a predetermined portion of the semiconductor substrate; (b) selectively laminating a gate insulating film and a conductor layer in this order on the semiconductor substrate to form a gate electrode of the MOS transistor, and selectively forming a silicide protection structure having an identical construction as the gate electrode on the first semiconductor layer; (c) performing an ion implantation of impurity by using the suicide protection structure and the gate electrode, as masks, to form a second semiconductor layer of a second concentration in the semiconductor substrate; and(d) forming a silicide film in a self-aligned manner on the second semiconductor layer by a salicide process, wherein the first concentration is lower than the second concentration; the second semiconductor layer is formed as a source/drain layer of the MOS transistor; and the first semiconductor layer has a conductivity type identical with that of the source/drain layer.

According to an sixteenth aspect of the present invention, the step (b) includes the step of forming the silicide protection structure so as to have an opening portion, at a bottom of which the first semiconductor layer is exposed; the method comprising the step, prior to the step (c), of forming a sidewall insulating film on side faces of the silicide protection structure and the gate electrode; wherein the sidewall insulating film is also formed on side faces of the conductor layer in the opening portion; and the step (c) includes the step of forming the second semiconductor layer in the first semiconductor layer of the opening portion bottom.

According to a seventeenth aspect of the present invention, the method of the seventeenth aspect further comprises the step of (e) forming a contact hole extending through the silicide protection structure to reach into the first semiconductor layer.

In the semiconductor device of the first aspect of the present invention, no silicide film is present on the first semiconductor layer beneath the silicide protection structure and the first semiconductor layer has a concentration lower than that of the source/drain layer, resulting in an electrically high resistance region. Thus, when a surge voltage is applied between the source and drain, a voltage drop due to the first semiconductor layer prevents the destroy of the MOS transistor. Additionally, by making the first semiconductor layer have a sheet resistance in k Ω unit, it is able to lessen the area required in lowering the surge voltage. Still further, the presence of the silicide film over the source/drain layer facilitates the decision of etching end point when forming a contact hole over the source/drain layer, preventing the over-etching of the source/drain layer.

In the semiconductor device of the second aspect of the present invention, since the first semiconductor layer is a semiconductor layer of a conductivity type opposite to that of the source/drain layer of the MOS transistor, a PN junction is formed with the source and drain layer to produce a region of electrically very high resistance.

In the semiconductor device of the third aspect of the present invention, since the first semiconductor layer is a semiconductor layer of a conductivity type identical with that of the source/drain layer of the MOS transistor, the resultant high resistance region has a lower resistance value as compared to cases where a PN junction is formed.

In the semiconductor device of the fourth aspect of the present invention, the insulating film of the silicide protection structure and the sidewall insulating film are formed simultaneously using the same material, requiring no etching step for forming the silicide protection structure only. Therefore, if a semiconductor substrate is, for example, an SOI substrate, the damage due to etching cannot be ignored because SOI layers are generally thin, however, no etching is needed in forming the silicide protection structure and thus avoids increasing the damage by etching the SOI layer.

In the semiconductor device of the fifth aspect of the present invention, the silicide protection structure and the field shield gate are formed simultaneously with the same construction, requiring no steps for forming the silicide protection structure only, e.g., etching. Therefore, if the semiconductor substrate is, for example, an SOI substrate, the damage due to etching cannot be ignored because SOI layers are generally thin, however, no additional steps, e.g., etching, for forming the silicide protection structure are required and thus avoids increasing damage by etching the SOI layer.

In the semiconductor device of the sixth aspect of the present invention, the silicide protection structure and the gate electrode are formed simultaneously with the same construction, requiring no steps for forming the silicide protection structure only, e.g., etching. If the semiconductor substrate is for example an SOI substrate, the damage due to etching cannot be ignored because SOI layers are generally thin, however, no additional steps, e.g., etching, for forming the silicide protection structure are required and thus avoids increasing damage by etching the SOI layer. In addition, since the gate electrode structure is utilized as a silicide protection structure, the silicide protection structure can be formed even in semiconductor devices without a special construction, such as the field-shield isolation structure, thereby leading to a wide applicability of the present invention.

In the semiconductor device of the seventh aspect of the present invention, a contact hole can be provided over at least one opening portion of at least one silicide protection structure. It is therefore unnecessary to provide the space for forming a contact hole over the source/drain layer. This construction is well suited for applications in which the size of an active region is limited.

In the semiconductor device of the eighth aspect of the present invention, a uniform flow of surge current can be obtained by that at least one silicide protection structure is adjusted to have the length of the gate electrode and the opening portions are arranged in a row in the longitudinal direction of the silicide protection structure.

In the semiconductor device of the ninth aspect of the present invention, since a plurality of silicide protection structures have the opening portions arranged in a row, respectively, the resistance value of the source/drain layer can be changed by modifying the opening portion in which a contact hole will be formed.

In the semiconductor device of the tenth aspect of the present invention, the presence of the silicide film between the silicide protection structures increases the area of the region of the silicide film, thus lowering the resistance value of the source/drain layer.

In the semiconductor device of the eleventh aspect of the present invention, the modification of the opening portion in which a contact hole will be formed enables to change the resistance value of the source/drain layer, and, since the silicide film is formed between the silicide protection structures, the area of the region of the silicide film is increased and thus lowers the resistance value of the source/drain layer.

In the semiconductor device of the twelfth aspect of the present invention, the modification of the opening portion in which a contact hole will be formed enables to change the resistance value of the source/drain layer, and, since the area of the region of the suicide film is reduced, the resistance value of the source/drain layer is increased.

The manufacturing method of the thirteenth aspect of the present invention provides a manufacturing method suited for the semiconductor device in accordance with the fifth aspect.

The manufacturing method of the fourteenth aspect of the present invention provides a manufacturing method suited for the semiconductor device in accordance with the seventh aspect.

The manufacturing method of the fifteenth aspect of the present invention provide a manufacturing method suited for the semiconductor device in accordance with the sixth aspect.

The manufacturing method of the sixteenth aspect of the present invention provides a manufacturing method suited for the semiconductor device in accordance with the seventh aspect.

In the manufacturing method of the seventeenth aspect of the present invention, the feature that the contact hole extends through the silicide protection structure to reach into the first semiconductor layer increases the alignment margin in forming a contact hole as compared to cases where an opening portion is formed in a silicide protection structure and a contact hole is formed therein. This simplifies the processing steps and suppresses the disadvantage associated with the positional drift of the contact hole, preventing a drop in yield. In addition, if the contact hole is filled with a conductor, the conductor is electrically connected to a conductor layer of the silicide protection structure to cause a parasite capacity between the conductor layer and a wiring layer, such as a gate wiring layer. As a result, a CR circuit is formed by the parasite capacity and the resistance components in the first semiconductor layer. When a sudden input of, such as a surge voltage, is applied, the surge voltage is reduced by the CR circuit to improve the protection capability of the MOS transistor to ESD.

An object of the present invention is to provide a semiconductor device with a silicide protection structure that prevents the over-etching of a source/drain layer in forming contact holes and permits a voltage drop of surge voltage without increasing the area of a source/drain layer, as well as a manufacturing method of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 20 is a plan view illustrating a construction of an MOS transistor according to a fourth preferred embodiment of the present invention;

FIG. 21 is a plan view illustrating a construction of an MOS transistor according to a fifth preferred embodiment of the present invention;

DESCRIPTION OF THE PREFERRED EMBODIMENTS

Introduction

Prior to the description of preferred embodiments of the present invention, semiconductor devices with a field-shield isolation structure will be described.

Figure 1:
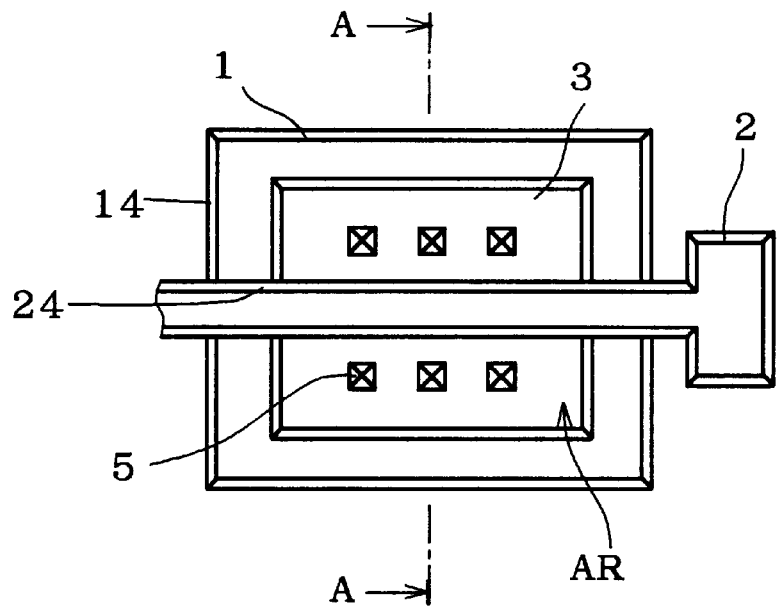
FIG. 1 is a plan view for explaining a field-shield isolation structure.

FIG. 1 shows a plan construction of a semiconductor device with a field-shield isolation structure. With reference to FIG. 1, there is defined a formation region (active region) AR for forming an MOS transistor and a field shield (hereinafter abbreviated as FS) gate electrode 1 that constitutes the field-shield isolation structure is formed in a rectangular loop shape and a gate electrode 2 of the MOS transistor is formed over the FS gate electrode 1 and the active region AR such that it divides the FS gate electrode 1 into two.

In active regions AR facing with each other across the gate electrode 2, a source/drain (hereinafter abbreviated as S/D) layer 3 is formed, respectively. A plurality of contact holes 5 that electrically connect an S/D wiring layer (not shown) are formed in the regions AR.

Figure 2:
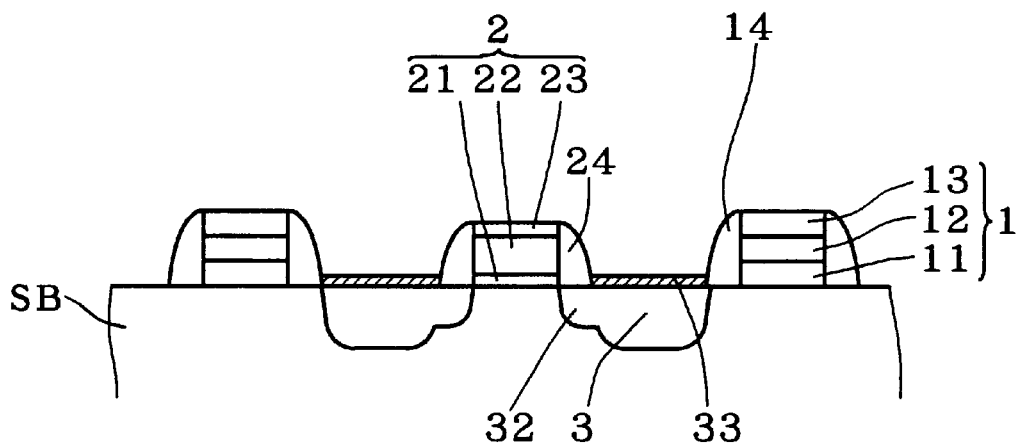
FIG. 2 is a cross-sectional view for explaining a field-shield isolation structure.

FIG. 2 shows a cross-sectional construction along line A—A of FIG. 1, i.e., a construction of an MOS transistor and an FS gate electrode formed over a bulk silicon substrate.

With reference to FIG. 2, a gate electrode 2 is formed on the surface of a silicon substrate SB. The gate electrode 2 comprises a gate oxide film 21 in contact with the surface of the silicon substrate SB, a polysilicon layer 22 over the gate oxide film 21, and a salicide layer 23 over the polysilicon layer 22. Sidewall oxide film 24 is formed on the side faces of these layers 21, 22, and 23. An S/D layer 3 and a lightly doped drain layer (hereinafter referred to as LDD layer) 32 are formed in the surface of the silicon substrate SB located on the adjacent sides across the gate electrode 2. The surface of the S/D layer 3 is covered with a salicide layer 33.

An FS gate electrode 1 is formed on the surface of the silicon substrate SB outside the S/D layer 3. The FS gate electrode 1 comprises an FS gate insulating film (which is oxide film) 11 in contact with the surface of the silicon substrate SB, a polysilicon layer 12 over the FS gate oxide film 11, and an FS upper insulating film (oxide film) 13 over the polysilicon layer 12. Sidewall insulating film (oxide film) 14 is formed on the side faces of these layers 11, 12, and 13.

In the semiconductor device with the field-shield isolation structure as discussed by referring to FIGS. 1 and 2, the reverse bias voltage to be applied to the FS gate electrode 1 prevents a depletion layer from extending beyond the region surrounded by the FS gate electrode 1, making possible electrical separation between elements.

The field-shield isolation structure has most commonly been used with the recent progress of the SOI devices formed on SOI substrates. Through the research of the field-shield isolation structure, the present inventors have surprisingly had a new technological idea of applying the field-shield isolation structure to silicide protections. Preferred embodiments of the present invention are described herebelow.

A. First Preferred Embodiment

A-1. Device Construction

Figure 3:
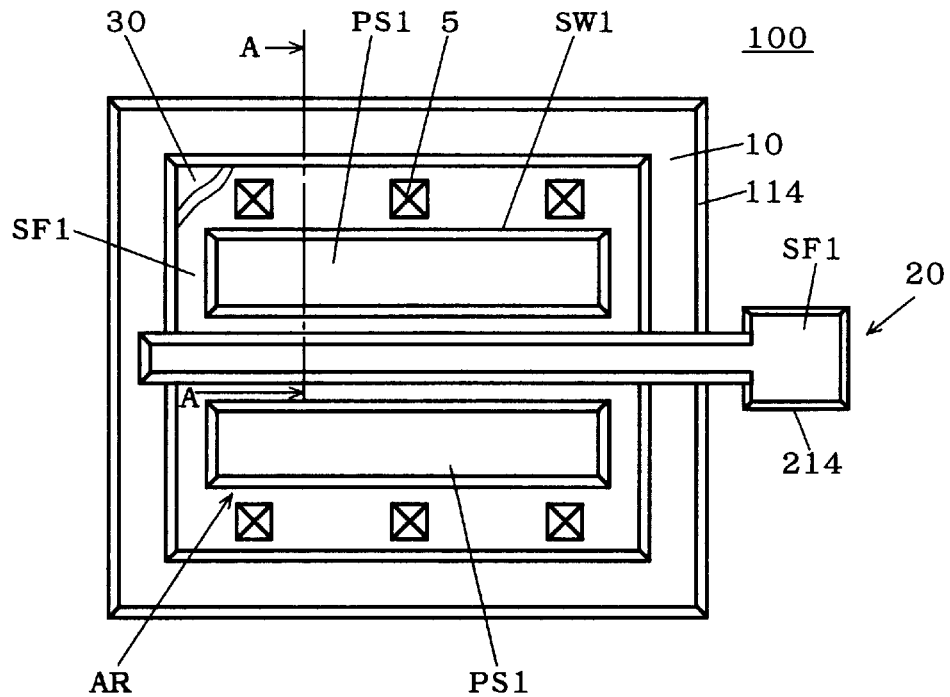
FIG. 3 is a plan view illustrating a construction of an MOS transistor according to a first preferred embodiment of the present invention.

FIG. 3 shows a plan construction of an MOS transistor 100 with a silicide protection structure according to a first preferred embodiment of the present invention.

With reference to FIG. 3, there is defined an active region AR of the MOS transistor and an FS gate electrode 10 that constitutes a field-shield isolation structure is formed in a rectangular loop shape. Over the FS gate electrode 10 and the active region AR, a gate electrode 20 of the MOS transistor is formed so as to divide the FS gate electrode 10 into two.

In the active regions AR facing with each other across the gate electrode 20, each silicide protection structure PS1 is disposed and its surrounding is an S/D layer 30 (a second semiconductor layer). Although the S/D layer 30 is invisible because a silicide film SF1 is formed over the S/D layer 30, in FIG. 3 the silicide film SF1 is cut in part to expose the S/D layer 30 for convenience. The silicide film SF1 is also present over the gate electrode 20. A plurality of contact holes 5 for electrical connection with an S/D wiring layer (not shown) are then formed in the silicide film SF1 over the S/D layer 30.

A-2. Manufacturing Method

Figure 4:
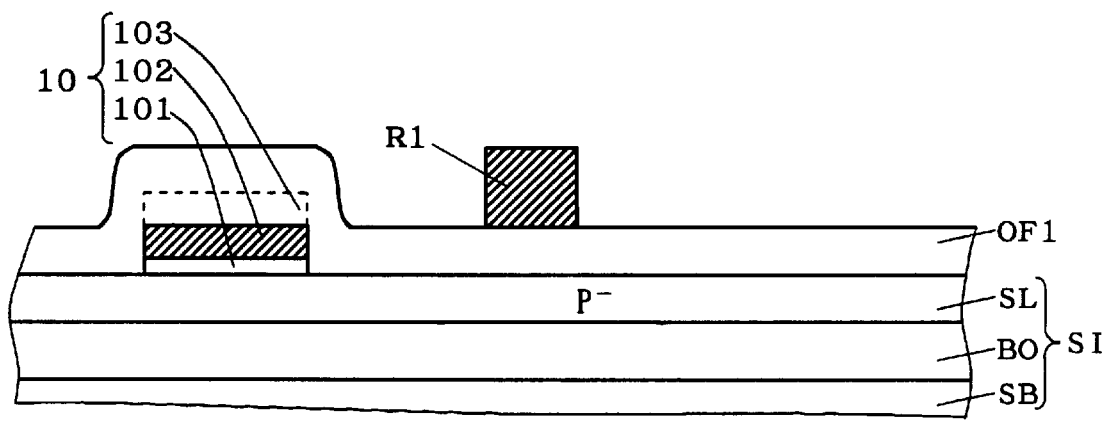
FIG. 4 is a cross-sectional view illustrating a processing step in manufacturing an MOS transistor of the first preferred embodiment.
Figure 5:
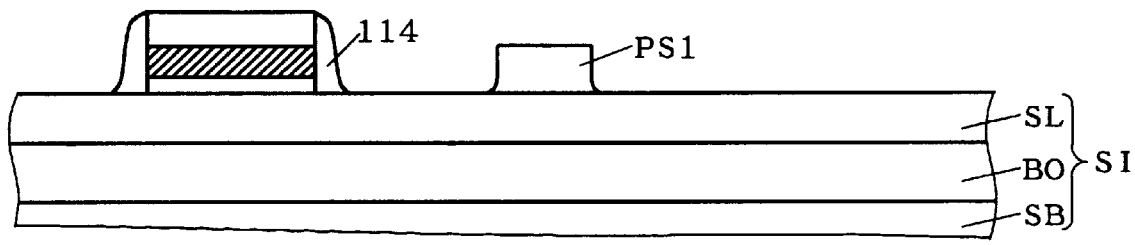
FIG. 5 is a cross-sectional view illustrating another processing step in manufacturing an MOS transistor of the first preferred embodiment.
Figure 6:
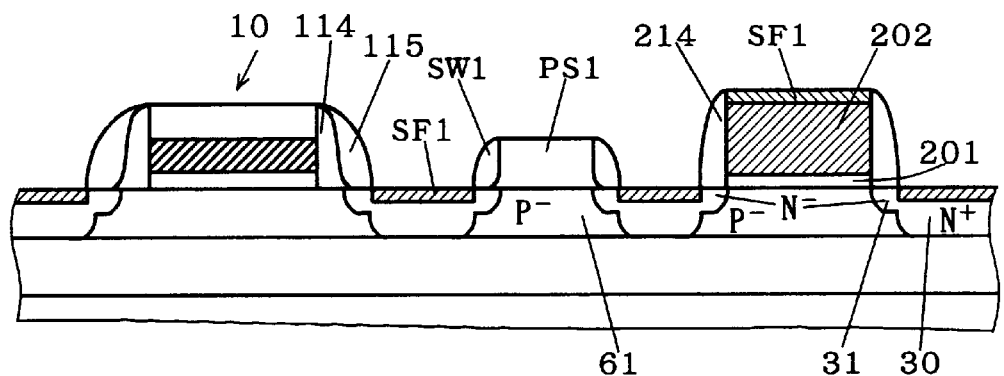
FIG. 6 is a cross-sectional view illustrating another processing step in manufacturing an MOS transistor of the first preferred embodiment.

With reference to FIGS. 4 to 6 showing consecutive processing steps, a method of manufacturing an MOS transistor 100 is described herebelow. FIGS. 4 to 6 are a partial sectional view along line A—A of FIG. 3. It should be noted that the MOS transistor 100 in the following description is an N channel transistor.

In the processing step shown in FIG. 4, an FS gate electrode 10 is formed over an SOI substrate SI. The FS gate electrode comprises an FS gate insulating film (oxide film) 101 in contact with the surface of an SOI layer SL, a polysilicon layer (conductor layer) 102 over the FS gate oxide film 101, and an FS upper insulating film (oxide film) 103 over the polysilicon layer 102.

An insulating film, i.e., an oxide film OF1, is formed over the entire surface of the FS gate electrode 10, thereafter, a resist mask R1 is selectively formed in a place whereat it is desired to provide a suicide protection structure PS1. It is noted at this point that a channel implantation has previously performed to the entire surface of the SOI layer SL, thereby obtaining a P⁻ layer with a relatively low concentration.

In the processing step shown in FIG. 5, a dry etching using the resist mask R1 as an etching mask is performed to form a sidewall insulating film (oxide film) 114 on the side face of the FS gate electrode 10 and form a silicide protection structure PS1.

A gate insulating film (oxide film) 201 and a polysilicon layer (conductor layer) 202 are laminated in this order over the SOI layer SL to form a gate electrode 20. By using, as mask, the FS gate electrode 10, the sidewall oxide film 114, the silicide protection structure PS1 and the gate electrode 20, an ion implantation using an N type impurity (e.g., As) is performed to the SOI layer, so that a lightly doped drain layer 31 is formed in a self-aliened manner in the surface of the SOI layer SL.

Next, to form a sidewall oxide film 214 of the gate electrode 20, an oxide film is formed over the entire surface and then an N type impurity (e.g., As) is implanted from above the oxide film by an ion implantation method to form an S/D layer 30 in a self aligned manner in the SOI layer SL, so that a relatively low concentration P⁻ layer remaining beneath the silicide protection structure PS1 becomes a high resistance layer 61 (first semiconductor layer).

Thereafter, the above oxide film is subjected to a dry etching to form a sidewall oxide film 214 on the sidewall of the gate electrode 20, a sidewall oxide film SW1 on the sidewall of the silicide protection structure PS1, and a further sidewall oxide film 115 on the sidewall of the sidewall oxide film 114.

With a salicide process, a silicide film SF1 is formed on the exposed surface of the silicon layer to produce the structure shown in FIG. 6. In the salicide process, a metal film, e.g., cobalt (Co), is entirely treated by sputtering to a thickness of about 100 Å, followed by heat treatment at a temperature of 400–500° C. for about 30–120 seconds. Then, the portion in which the metal film and the silicon film are in contact is reacted to form a silicide film. Thereafter, the non-reacted portion is removed by wet etching, followed by a heat treatment at a temperature of 800–900° C. for 30–120 seconds, so that a silicide film is formed in a self-aliened manner in the exposed surface of the silicon layer.

A-3. Characteristic Effect

Thus, in the MOS transistor 100, the silicide protection structure PS1 surrounded by the N type S/D layer 30 and the P type low concentration region in the SOI layer SL beneath the silicide protection structure PS1 form a PN junction to produce a region of electrically very high resistance. In this case, if the width of the silicide protection structure PSI is adjusted to be approximately equal to that of the gate electrode, the current will flow due to punch-through.

Figure 7:
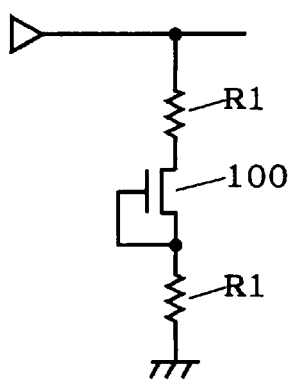
FIG. 7 is a diagram showing an equivalent circuit of an MOS transistor according to the present invention.

FIG. 7 shows an equivalent circuit of an MOS transistor 100. As shown in FIG. 7, a resistance R1 is added to the source electrode and drain electrode of the MOS transistor 100, respectively. When a surge voltage is applied between the S/D, a voltage drop occurs due to the resistance R1 to prevent the destroy of the MOS transistor 100. In addition, since the above high resistance region has a sheet resistance in k Ω unit, no large area is required and hence free from the problem of being negative toward device downsizing.

Figure 8:
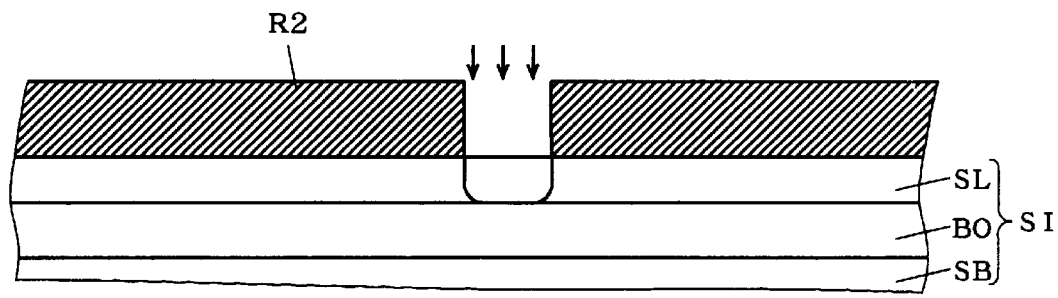
FIG. 8 is a cross-sectional view illustrating a modified processing step of the first preferred embodiment.

Although the above description illustrates the SOI layer SL beneath the silicide protection structure PS1 that has a certain impurity concentration by channel doping, if it is desired to change the concentration or the conductivity type of the impurity layer, prior to the processing step shown in FIG. 4, a resist mask R2 having an opening portion only for portion in which a silicide protection structure PS1 will be provided is formed over the SOI substrate SI and then an impurity is implanted so as to have a desired concentration or conductivity type, as shown in FIG. 8.

For instance, if an N type impurity is implanted into the SOI layer SL beneath the silicide protection structure PS1 such that the dose is approximately $5 \times 10^{12}/cm^2$, no PN junction is formed, however, suppose the depth of junction is approximately 100 nm, the sheet resistance would be approximately 4 k Ω/□, permitting a drop in surge voltage.

In addition, the presence of the silicide film SF1 over the S/D layer 30 facilitates the decision of etching end when a contact hole is formed later in the process, causing no over-etching of the S/D layer.

Furthermore, although the damage due to etching cannot be ignored because SOI layers in SOI substrates are generally thin, in the first preferred embodiment of the present invention, the silicide protection structure is utilized in forming a sidewall oxide film to be formed on the side face of the FS gate electrode, thus requiring no further etching for forming the silicide protection structure. This prevents an increase in damage by etching the SOI layer.

A-4. Modified Example

Although the first preferred embodiment illustrates the SOI device formed on the SOI substrate, the present invention is not limited to SOI devices and applies as well to bulk silicon substrates. It may also be applied to SOI devices and bulk devices that have no field-shield isolation structure.

That is, a silicide protection structure comprising an insulating film (e.g., oxide film) and a low-concentration semiconductor layer thereunder permit applications to any semiconductor substrates. It should be noted that the application to SOI devices or bulk devices without a field-shield isolation structure calls for processing steps comprising forming an oxide film only for forming a silicide protection structure composed of insulating film (e.g., oxide film) and etching the oxide film, and therefore, an additional etching is needed, however, the resulting effect is the same.

B. Second Preferred Embodiment

B-1. Device Construction

Figure 9:
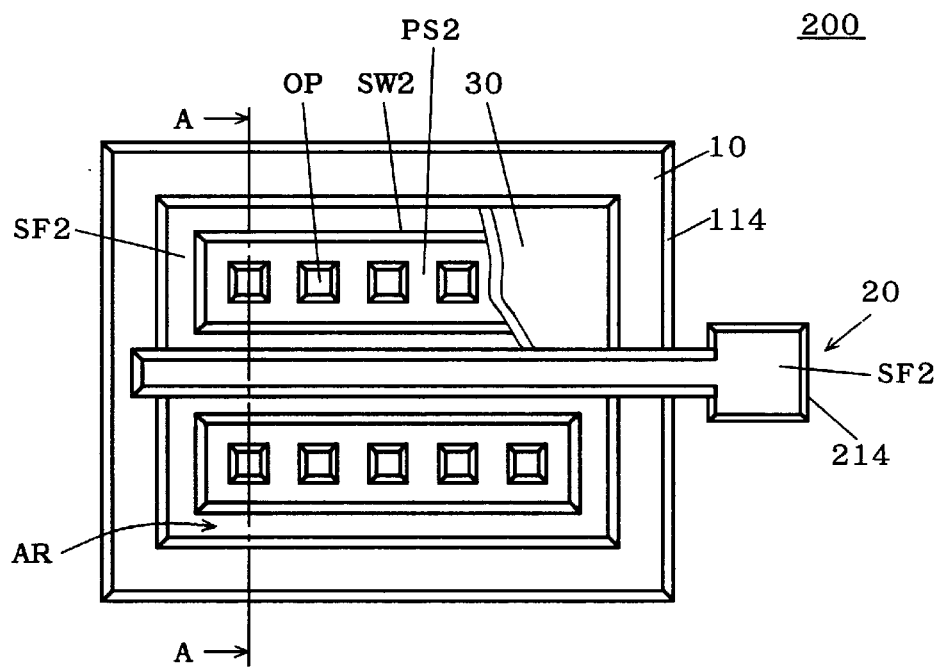
FIG. 9 is a plan view illustrating a construction of an MOS transistor according to a second preferred embodiment of the present invention.

FIG. 9 shows a plan construction of an MOS transistor 200 with a silicide protection structure according to a second preferred embodiment of the present invention.

With reference to FIG. 9, there is defined an active region AR of an MOS transistor, and an FS gate electrode 10 that constitutes a field-shield isolation structure is formed in a rectangular loop shape. Over the FS gate electrode 10 and the active region AR, a gate electrode 20 of the MOS transistor is formed so as to divide the FS gate electrode 10 into two.

In active regions AR facing with each other across the gate electrode 20, a silicide protection structure PS2 is respectively disposed and its surrounding is an S/D layer 30. The contours of the silicide protection structures PS2 in plan view are in a slender form and are arranged in parallel in the longitudinal direction of the gate electrode 20. A plurality of opening portions OP are arranged in a row in the longitudinal direction of the silicide protection structure PS2, and the undersides of the opening portions OP are composed of the S/D layer 30. Here, the S/D layer 30 is invisible because a silicide film SF2 is formed over the S/D layer 30, but in FIG. 9, the silicide film SF2 and the silicide protection structure PS2 are cut in part to expose the S/D layer 30 for convenience.

B-2. Manufacturing Method

With reference to FIGS. 10 to 15 showing consecutive processing steps, a method of manufacturing an MOS transistor 200 is described herebelow. FIGS. 10 to 15 are a partial sectional view along line A—A of FIG. 9. It is noted that the MOS transistor 200 in the following description is an N channel transistor.

Figure 10:
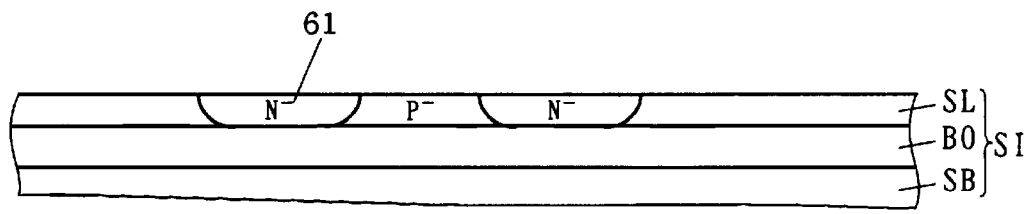
FIG. 10 is a cross-sectional view illustrating a processing step in manufacturing an MOS transistor of the second preferred embodiment.

Firstly, in the processing step shown in FIG. 10, a channel implantation is performed into the surface of an SOI layer SL of an SOI substrate SI. As ion implanted, boron (B) is implanted at the energy of several ten keV such that the dose is on the order of $10^{12}/cm^2$. As a result, the SOI layer SL becomes a P$^-$ layer of a relatively low concentration. At the same time the channel implantation is performed to the region (normal region) in which a normal MOS transistor requiring no silicide protection will be formed.

Subsequently, an N type impurity is selectively implanted in a low concentration into the region in which a silicide protection structure will be formed, to form two parallel high resistance layers 61 (first semiconductor layer). As ion implanted, phosphorus (P) is implanted at the energy of several ten keV such that the dose is on the order of $10^{12}/cm^2$.

Figure 11:
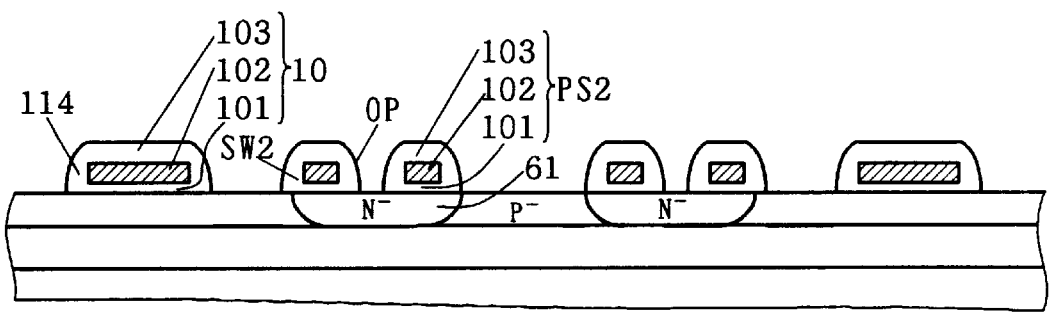
FIG. 11 is a cross-sectional view illustrating another processing step in manufacturing an MOS transistor of the second preferred embodiment.
Figure 12:
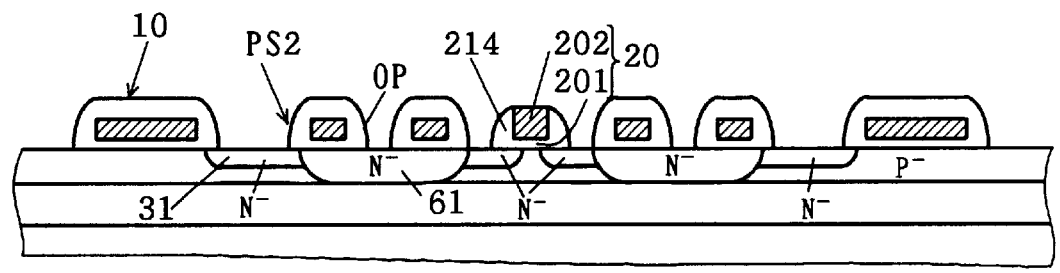
FIG. 12 is a cross-sectional view illustrating another processing step in manufacturing an MOS transistor of the second preferred embodiment.

In the processing step shown in FIG. 11, an FS gate electrode 10 is formed over the SOI layer SL. The FS gate electrode 10 comprises an FS gate oxide film 101 in contact with the surface of the SOI layer SL, a polysilicon layer 102 over the FS gate oxide film 101, and an FS upper oxide film 103 over the polysilicon layer 102. At the same time, a silicide protection structure PS2 having the same construction as the FS gate electrode 10 is also formed over the high resistance layers 61. That is, the structure PS2 serve as a dummy FS gate electrode.

The FS gate electrode 10 is electrically connected to a predetermined wiring layer by a contact hole (not shown) while the polysilicon layer 102 of the silicide protection structure PS2 may be in an electrically floated state.

Although in FIG. 11 two silicide protection structures PS2 are illustrated as if they were formed over a single high resistance layer 61, it should be understood to be the representation of the opening portion OP of the structure PS2.

Then, after an insulating film (oxide film) is formed over the entire surface, a dry etching is performed to form a sidewall oxide film 114 on the side face of the FS gate electrode 10 and a sidewall oxide film SW2 on the side face of the silicide protection structure PS2.

Next, a gate oxide film 201 and a polysilicon layer 202 are subsequently laminated in a region surrounded by the two high resistance layers 61 over the SOI layer SL, to form a gate electrode 20. Thereafter, by using, as mask, the FS gate electrode 10, the sidewall oxide film 114, the silicide protection structure PS2, the sidewall oxide film SW2, and the gate electrode 20, an N type impurity is implanted in a low concentration into the SOI layer SL so that a lightly doped drain layer 31 is formed in a self-aligned manner in the surface of the SOI layer SL, thereby obtaining the resultant structure shown in FIG. 12. As ion implanted, phosphorus (P) is implanted at the energy of several ten keV such that the dose is on the order of $10^{13}/cm^2$. Then, a sidewall oxide film 214 of the gate electrode 20 is formed. The polysilicon layer 202 that constitutes the gate electrode 20 is formed so that it contains the N type impurity in a high concentration. For this, the CVD process may be employed while introducing the N type impurity, alternatively, an N type impurity may be implanted with an ion implantation after forming a non-doped polysilicon layer.

Figure 13:
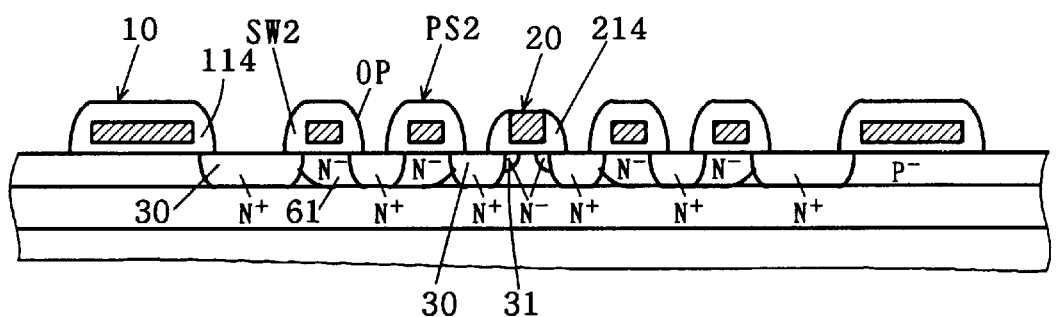
FIG. 13 is a cross-sectional view illustrating another processing step in manufacturing an MOS transistor of the second preferred embodiment.

With respect to FIG. 13, by using, as mask, the FS gate electrode 10, the sidewall oxide film 114, the silicide protection structure PS2, the sidewall oxide film SW2, the gate electrode 20, and the sidewall oxide film 214, an N type impurity is implanted into the SOI layer SL so that an S/D layer 30 is formed in a self-aligned manner in the surface of the SOI layer SL. As ion implanted, phosphorus (P) is implanted at the energy of several ten keV such that the dose is on the order of $10^{15}/cm^2$. As a result, the lightly doped drain layer 31 is left only beneath the sidewall oxide film 214, and an S/D layer 30 is also formed inside the high resistance layer 61 facing the opening portion OP of the silicide protection structure PS. The S/D layer 30 inside the high resistance layer 61 serves to lower the ohmic resistance when forming a contact hole later in the process, rather than serves as an S/D layer.

Figure 14:
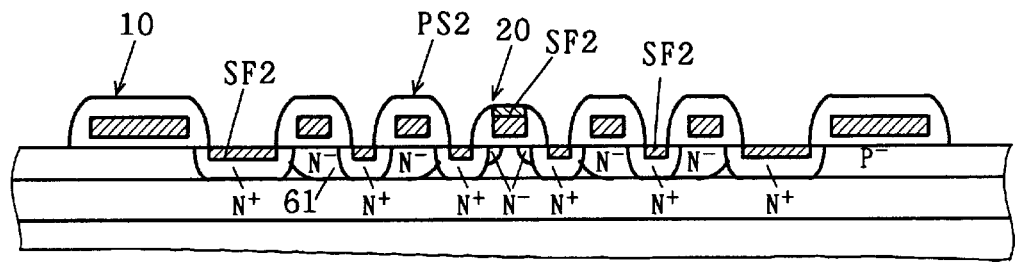
FIG. 14 is a cross-sectional view illustrating another processing step in manufacturing an MOS transistor of the second preferred embodiment.

In the processing step shown in FIG. 14, with a salicide process, a silicide film SF2 is formed on the exposed face of a silicon layer, i.e., the exposed faces of the S/D layer 30 and the polysilicon layer 202.

Figure 15:
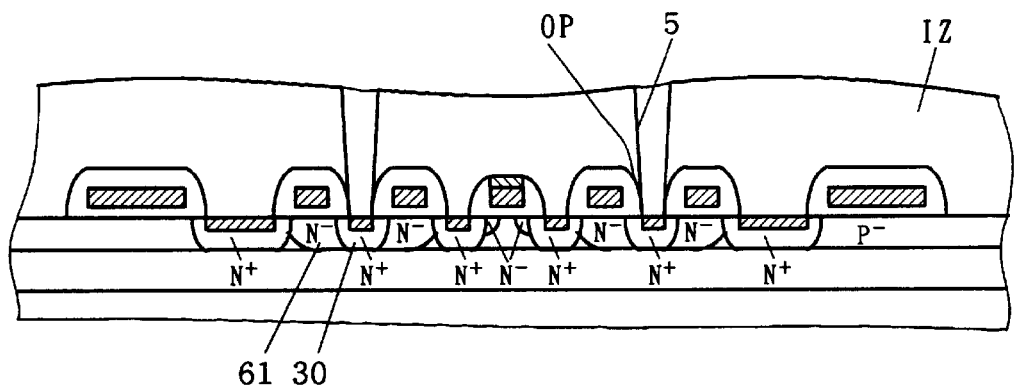
FIG. 15 is a cross-sectional view illustrating another processing step in manufacturing an MOS transistor of the second preferred embodiment.

Finally, with respect to FIG. 15, an interlayer insulating film IZ is formed over the entire surface of the SOI substrate SI, and a contact hole 5 is formed so as to reach the silicide film SF2 of the opening portion OP in the silicide protection structure PS2. It is noted that although the S/D layer 30 is to be connected to the S/D wiring layer through a conductor layer filled in the contact hole 5, their representations are omitted in FIG. 15.

B-3. Characteristic Effect

Thus in the MOS transistor 200, the silicide protection structure PS2 is surrounded by the S/D layer 30 and the inside of the SOI layer SL beneath the structure PS2 is the high resistance layer 61. Here, suppose the high resistance layer 61 (N$^-$ layer) is formed in the dose of approximately $5 \times 10^{12}/cm^2$ and the depth of junction is approximately 100 nm, its sheet resistance would be about 4 k $\Omega/\square$.

Therefore, when a surge voltage is applied between the S/D, due to the presence of the high resistance layer 61, a voltage drop occurs to prevent the destroy of the MOS transistor 200. Since the high resistance layer 61 has a sheet resistance in k Ω unit, no large area is required and hence free from the problem of being negative toward device downsizing.

To form the silicide film SF2 over the S/D layer 30 and to form a contact hole so as to reach the opening portion of the silicide protection structure PS2 facilitate the decision of etching end, causing no over-etching of the S/D layer.

Still further, although the damage due to etching cannot be ignored because SOI layers in SOI substrates are generally thin, in the second preferred embodiment of the present invention, the formation of the suicide protection structure is utilized in the processing step of forming the FS gate electrode, so that no further etching step for forming the silicide protection structure is required to prevent an increase in damage by etching the SOI layer.

B-4. First Modified Example

Although in the second preferred embodiment the high resistance layer 61 is formed by implanting an N type impurity into the SOI layer SL beneath the silicide protection structure PS2, since the SOI layer SL becomes a P⁻ layer that has a low concentration by channel doping, the P⁻ layer may be left so that it serves as a high resistance region.

In this case, a PN junction is formed between the remaining P⁻ layer and the S/D layer 30 and the resistance value is extremely high, however, the resistance value is adjustable by applying the voltage to the polysilicon layer 202 of the silicide protection structure PS2 so that a channel is formed in the P⁻ layer. To apply the voltage to the polysilicon layer 202, it is necessary to connect a wiring layer through a contact hole. This can be dealt with a general technique and therefore it is not discussed herein.

B-5. Second Modified Example

In the second preferred embodiment the silicide protection structure PS2 is not in contact with the sidewall oxide film 114 of the FS gate electrode 10. Alternatively, the sidewall oxide film SW2 of the structure PS2 may be in contact with the sidewall oxide film 114 of the FS gate electrode 10.

Figure 16:
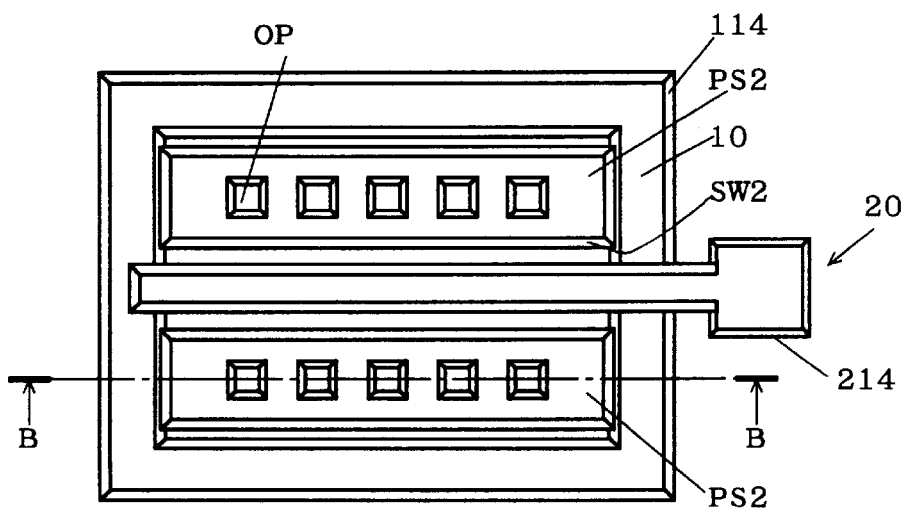
FIG. 16 is a plan view showing a modified construction of the second preferred embodiment.

Specifically, as shown in FIG. 16, the sidewall oxide film SW2 of the edge portion in the longitudinal direction of the silicide protection structure PS2 can be in contact with the sidewall oxide film 114 of the FS gate electrode 10.

Figure 17:
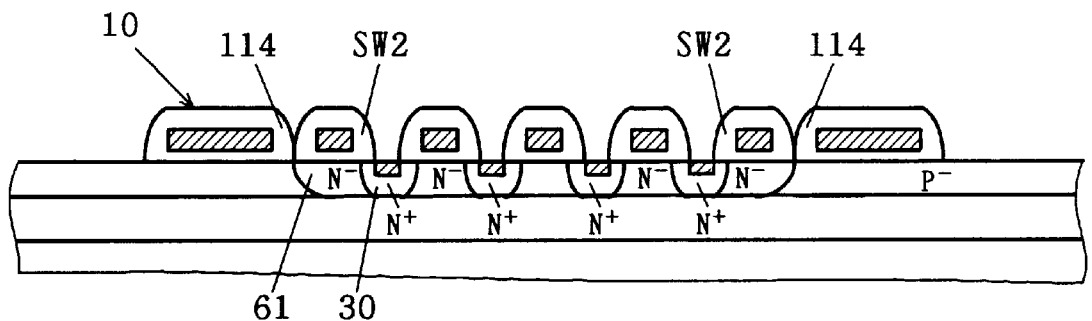
FIG. 17 is a cross-sectional view illustrating the modified construction of the second preferred embodiment.

FIG. 17 shows a sectional construction along line B—B of FIG. 16. With respect to FIG. 17, the sidewall oxide film SW2 is in contact with the sidewall oxide film 114, whereas the polysilicon layers 102 of the silicide protection structure PS2 and that of the FS gate electrode 10 are not in contact with each other, and therefore, the structure PS2 does not function as an FS gate electrode.

It should be noted that a mere contact between the sidewall oxide films SW2 of the silicide protection structure PS2 and the sidewall oxide film 214 of the gate electrode 20 causes no problem.

B-6. Third Modified Example

In the second preferred embodiment an opening portion OP is provided partially in the silicide protection structure PS2 and a contact hole reaches the silicide film SF2 of the opening portion OP. Alternatively, the contact hole may reach the silicide film SF2 around the silicide protection structure, without providing an opening portion in the silicide protection structure.

Figure 18:
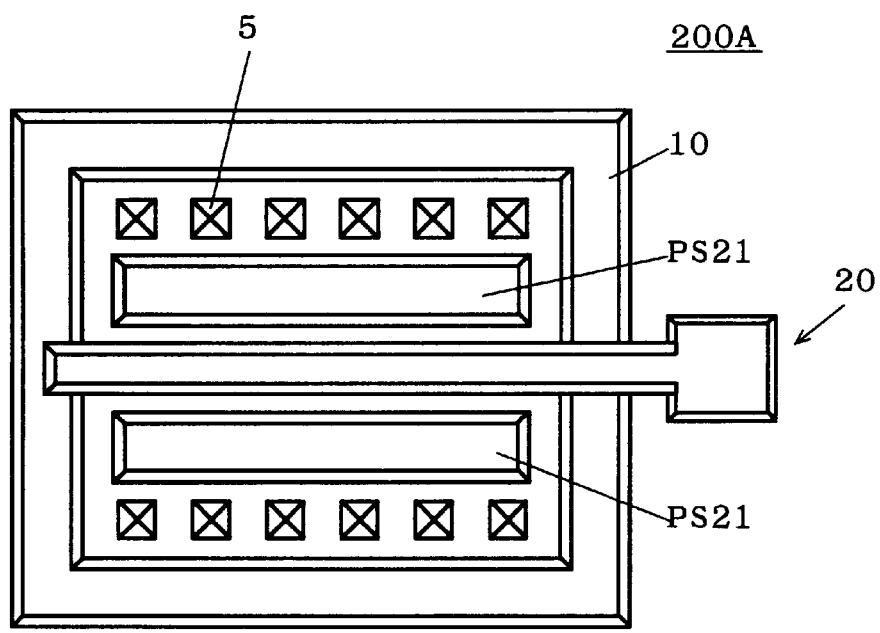
FIG. 18 is a plan view illustrating the modified construction of the second preferred embodiment.

That is, as an MOS transistor 200A shown in FIG. 18, a silicide protection structure PS21 may be formed in the vicinity of a gate electrode 20 so that contact holes 5 reach on the surface of a silicide film SF2 between the silicide protection structure PS21 and a gate electrode 10. With this construction, the shape of the silicide protection structure PS21 becomes a simple rectangle to facilitate manufacturing.

Still further, the alignment margin in forming the contact holes 5 is increased. This simplifies the processing steps and also prevents the disadvantage associated with the positional drift of the contact holes 5 to suppress a drop in yield.

C. Third Preferred Embodiment

C-1. Device Construction

Figure 19:
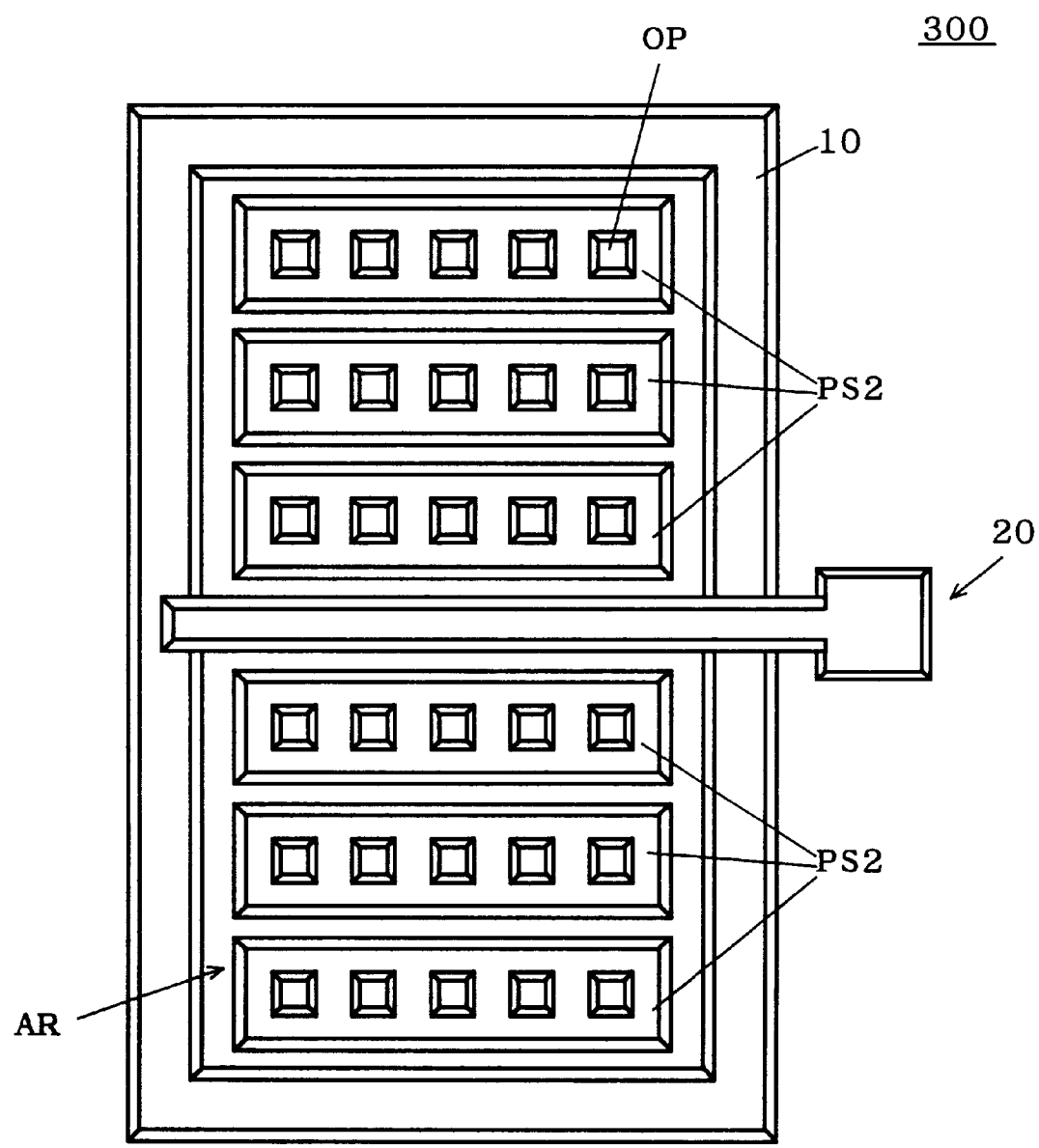
FIG. 19 is a plan view illustrating a construction of an MOS transistor according to a third preferred embodiment of the present invention.

FIG. 19 shows a plan construction of an MOS transistor 300 with a silicide protection structure according to a third preferred embodiment of the present invention. In the MOS transistor 200 as described by referring to FIGS. 9 to 15, although a single active region has a single silicide protection structure, a plurality of silicide protection structure can be formed in a single active region.

That is, as shown in FIG. 19, a plurality of silicide protection structures PS2 may be arranged in parallel to a gate electrode 20 in active regions AR facing with each other across the gate electrode 20.

C-2. Characteristic Effect

To arrange a plurality of silicide protection structures in a single active region increases the degree of freedom in the location of a contact hole. Therefore, the resistance value of an S/D layer can be changed by varying the location of the contact hole.

Specifically, since each silicide protection structure PS2 has opening portions OP arranged in a row, the resistance value of the S/D layer can be changed by modifying the opening portions in which a contact hole will be formed.

For instance, to obtain the lowest resistance value of the S/D layer, a contact hole should be formed over the opening portion OP of the innermost silicide protection structure PS2. By contrast, to obtain the highest resistance value of the S/D layer, a contact hole should be formed over the opening portions OP of the outermost silicide protection structure PS2.

Accordingly, more fine adjustment of the resistance value of the S/D layer is attained as the number of the silicide protection structures PS2 is increased.

D. Fourth Preferred Embodiment

D-1. Device Construction

FIG. 20 shows a plan construction of an MOS transistor 400 with a silicide protection structure according to a fourth preferred embodiment of the present invention. In the MOS transistor 300 as described by referring to FIG. 19, a plurality of silicide protection structures are arranged in a single active region. However, from the viewpoint of adjusting the resistance value of the S/D layer, one silicide protection structure per active region is enough if opening portions can be formed in the vertical and lateral directions.

That is, as shown in FIG. 20, a single silicide protection structure PS3 having a plurality of opening portions OP arranged in the vertical and lateral directions should be formed in a single active region.

D-2. Characteristic Effect

In this manner, the resistance value of the S/D layer can be changed by forming the silicide protection structure PS3 with a plurality of opening portions OP arranged in the vertical and lateral directions and altering the locations of the opening portions in which a contact hole will be formed.

In addition, as compared to cases where a plurality of silicide protection structures PS2 are arranged as shown in FIG. 19, the area of the region in which a silicide film will be formed can be lessened to increase the resistance value of the S/D layer.

E. Fifth Preferred Embodiment

E-1. Device Construction

FIG. 21 shows a plan construction of an MOS transistor 500 with a silicide protection structure according to a fifth preferred embodiment of the present invention. In the MOS transistor 200 as described by referring to FIGS. 9 to 15, the silicide protection structure PS1 is slender, arranged in parallel to the longitudinal direction of the gate electrode 20, and comprises a plurality of opening portions OP arranged in a row. Alternatively, there may be arranged silicide protection structures, each of which has only one opening portion.

That is, as shown in FIG. 21, a plurality of rectangular silicide protection structures PS4, each having a single opening portion, may be properly spaced in a row along the gate electrode 20 in active regions AR facing with each other across the gate electrode 20.

E-2. Characteristic Effect

With the above construction, a silicide film SF2 is to be formed between the silicide protection structures PS4 to increase the area of the region in which a silicide film will be formed, thereby lowering the resistance value of an S/D layer.

Although the silicide protection structures PS4 shown in FIG. 21 are of approximately square, they may be of rectangle.

F. Sixth Preferred Embodiment

F-1. Device Construction

Figure 22:
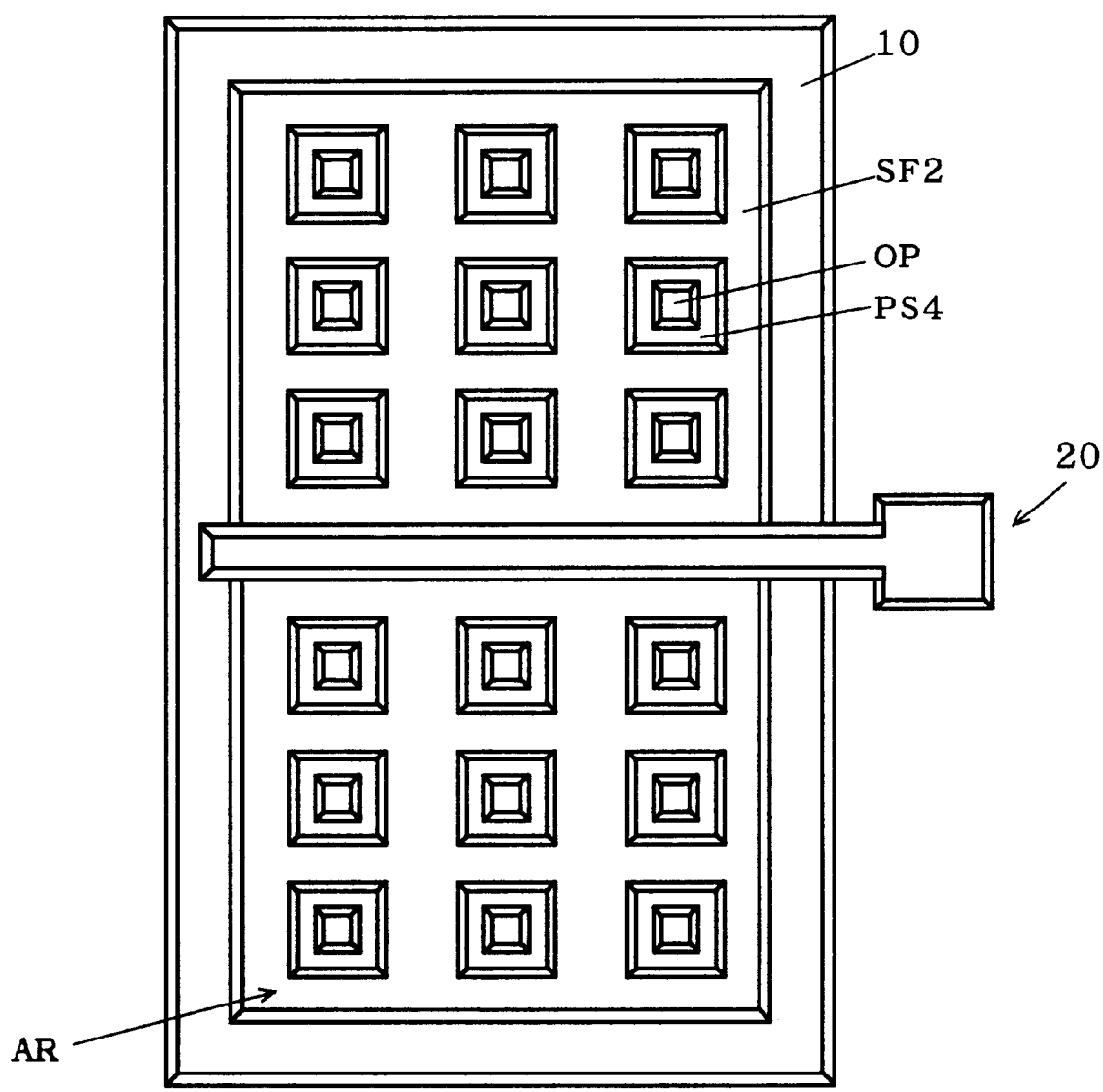
FIG. 22 is a plan view illustrating a construction of an MOS transistor according to a sixth preferred embodiment of the present invention.

FIG. 22 shows a plan construction of an MOS transistor 600 with a silicide protection structure according to a sixth preferred embodiment of the present invention. In the MOS transistor 500 as described by referring to FIG. 21, the silicide protection structures PS4 with one opening portion are properly spaced in a row along the gate electrode 20. Alternatively, the structures PS4 are not necessarily arranged in a single row and they can be arranged in the vertical and lateral directions.

That is, as shown in FIG. 22, a plurality of silicide protection structures PS4 are properly spaced in the vertical and lateral directions to form a plurality of rows in active regions AR facing with each other across the gate electrode 20.

F-2. Characteristic Effect

With the above construction, a silicide film SF2 is to be formed between the silicide protection structures PS4 to increase the area of the region in which a silicide film will be formed, thereby lowering the resistance value of an S/D layer.

In addition, the presence of the opening portions OP in the vertical and lateral directions over the S/D layer increases the degree of freedom in the location of a contact hole. It is therefore possible to change the resistance value of the S/D layer by altering the location of the contact hole.

Instead of the silicide protection structure PS4 with a single opening portion, a plurality of suicide protection structures, each having a plurality of opening portions, may be properly spaced in the vertical and lateral directions, resulting in the same effect as mentioned above.

It should be noted that although the silicide protection structures in the foregoing preferred embodiments are symmetrically placed in the adjacent active regions, they are not necessarily symmetrical.

G. Seventh Preferred Embodiment

G-1. Device Construction

Figure 23:
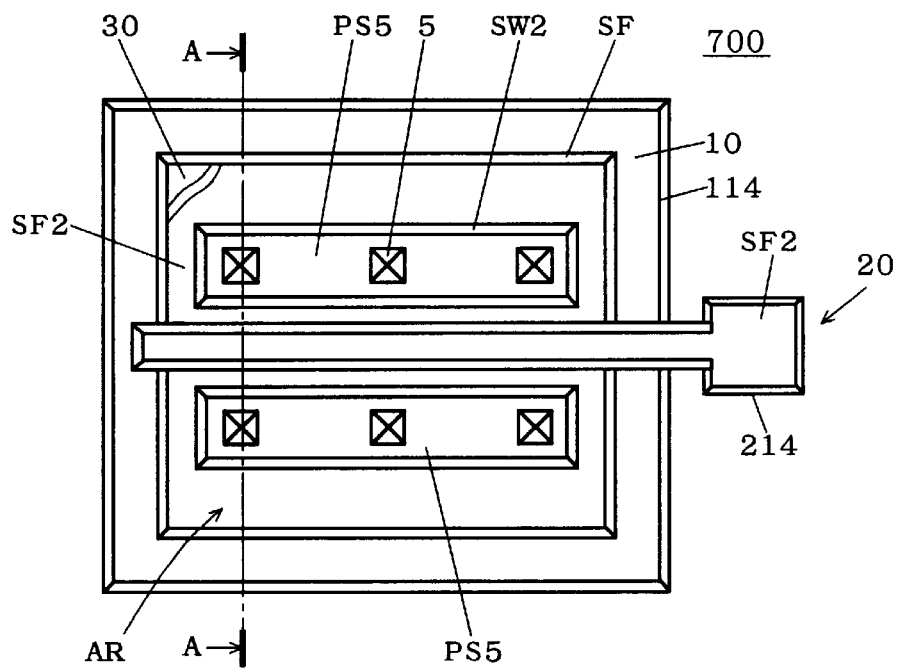
FIG. 23 is a plan view illustrating a construction of an MOS transistor according to a seventh preferred embodiment of the present invention.

FIG. 23 shows a plan construction of an MOS transistor 700 with a silicide protection structure according to a seventh preferred embodiment of the present invention.

In the second to sixth preferred embodiments, a contact hole is formed in the opening portion provided in the silicide protection structure . Alternatively, without forming an opening portion in the silicide protection structure, a contact hole may be formed such that it extends through the silicide protection structure.

That is, as shown in FIG. 23, without opening portion in the silicide protection structure PS5, contact holes 5 that electrically connect an S/D wiring layer (not shown) may be formed.

In FIG. 23, the components common to the MOS transistor 200 as described by referring to FIG. 9 are indicated by the same reference numeral and therefore their descriptions are omitted herein.

G-2. Manufacturing Method

A method of manufacturing the MOS transistor 700 is described herebelow by referring to FIGS. 24 to 27 showing consecutive processing steps. FIGS. 24 to 27 are a partial sectional view along line A—A of FIG. 23. In the following description the MOS transistor 700 is understood to be an N channel transistor.

Figure 24:
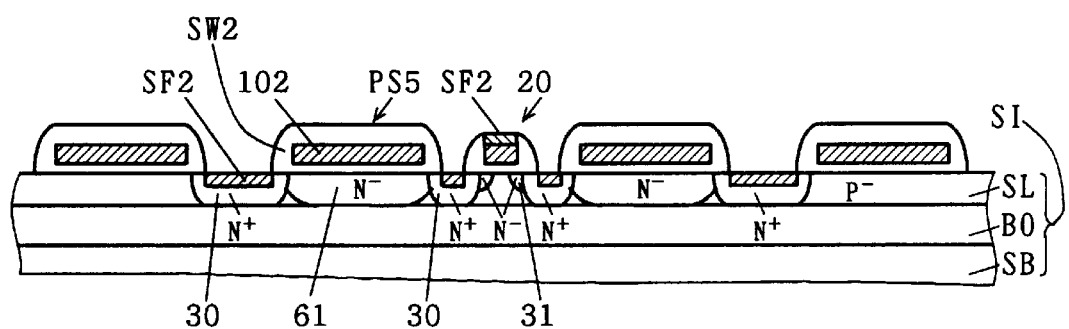
FIG. 24 is a cross-sectional view illustrating a processing step in manufacturing an MOS transistor of the seventh preferred embodiment.

The processing steps up to the construction shown in FIG. 24 are almost same as those of the MOS transistor 200 as described with respect to FIGS. 10 to 15, and therefore, their descriptions are omitted herein. However, it should be mentioned that since no opening portion is formed in the silicide protection structure PS5, neither an S/D layer 30 nor a silicide film SF2 is formed in the underlying high resistance layer 61.

Figure 25:
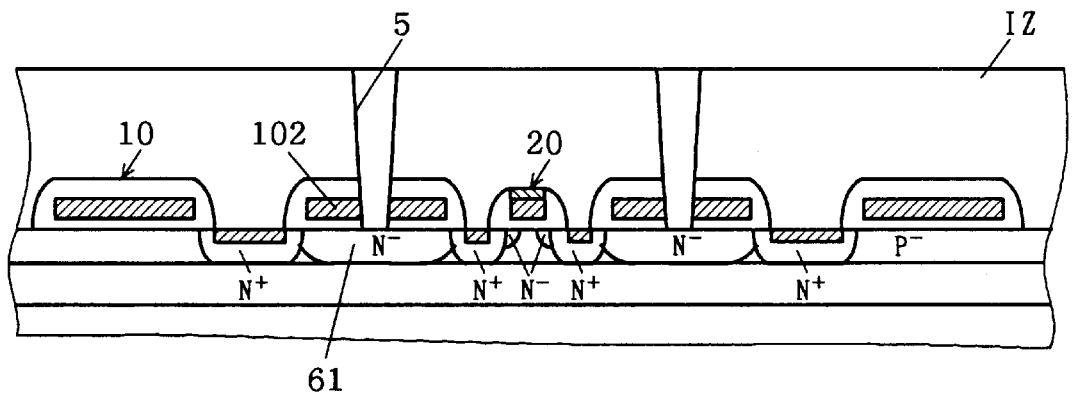
FIG. 25 is a cross-sectional view illustrating another processing step in manufacturing an MOS transistor of the seventh preferred embodiment.

In the processing step shown in FIG. 25, an interlayer insulating film IZ is formed over the entire surface of an SOI substrate SI and a contact hole 5 is formed such that it extends through the interlayer insulating film IZ and further a silicide protection structure PS5 to reach a high resistance layer 61. At this time, a contact hole is also formed in a normal region requiring no silicide protection so that it reaches a silicide film, whereas in an MOS transistor 700, a contact hole extends through a polysilicon layer 102 to lessen the over-etching caused by the difference in material to be etched.

Figure 26:
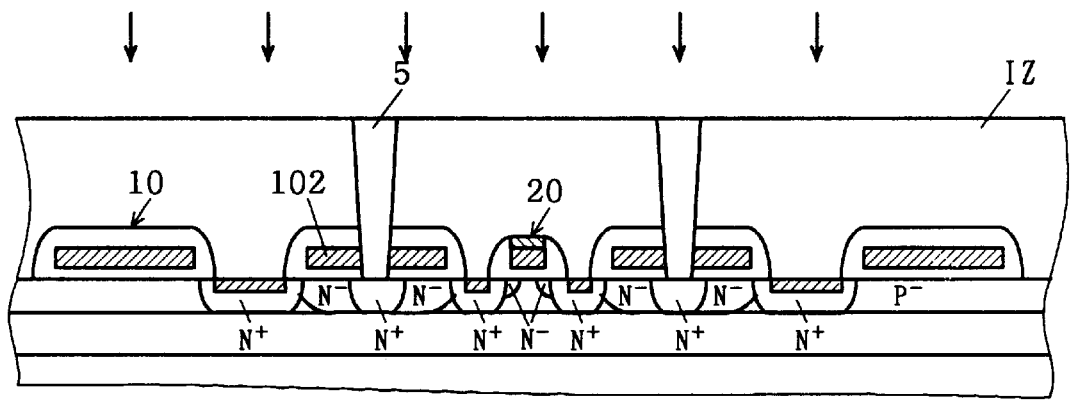
FIG. 26 is a cross-sectional view illustrating another processing step in manufacturing an MOS transistor of the seventh preferred embodiment.

In the processing step shown in FIG. 26, by using the interlayer insulating film IZ as mask, an N type impurity is implanted into an SOI layer SL at the bottom of the contact hole 5 so that an S/D layer 30 is formed in a self-aligned manner in the surface of the SOI layer SL. As ion implanted, phosphorus (P) is implanted at the energy of several ten keV such that the dose is on the order of $10^{15}/cm^2$.

Figure 27:
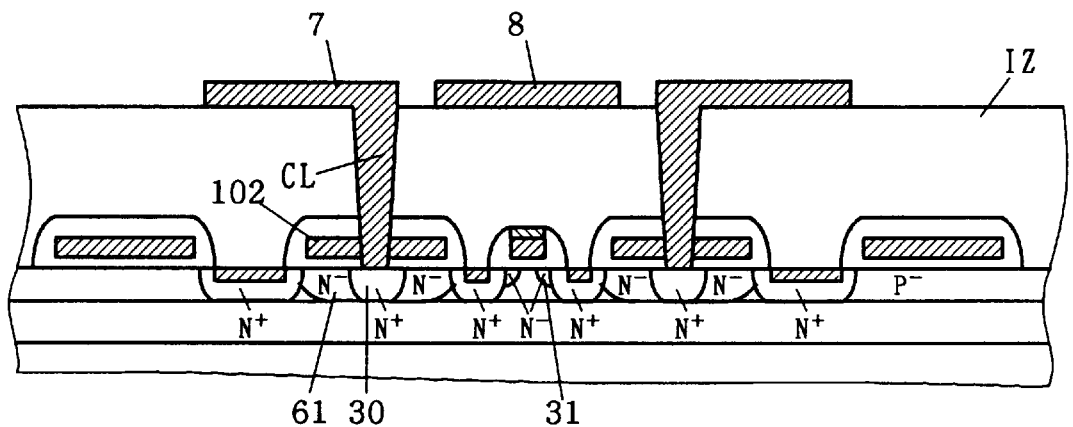
FIG. 27 is a cross-sectional view illustrating another processing step in manufacturing an MOS transistor of the seventh preferred embodiment.

In the processing step shown in FIG. 27, a buried conductor CL is filled in the contact hole 5 and an S/D wiring layer 7 is formed over the interlayer insulating film IZ so as to be connected to the buried conductor CL. At the same time, a gate wiring layer 8 and the like that will be electrically connected to a gate electrode 20 are formed. The contact hole 5 may be buried at the same time when the S/D wiring layer 7 is formed.

G-3. Characteristic Effect

Thus, since the MOS transistor 700 has the contact hole 5 extending through the silicide protection structure PS5, the alignment margin in forming an opening portion is increased as compared to cases where an opening portion is formed and a contact hole is provided therein. This simplifies the processing steps and prevents the disadvantage associated with the positional drift of the contact hole 5, thereby suppressing a drop in yield.

In addition, since the buried conductor CL in the contact hole 5 is to be in contact with a polysilicon layer 102 of which the suicide protection structure PS5 is composed, a parasite capacity occurs between the polysilicon layer 102 and wiring layers, such as the gate wiring layer 8. As a result, a CR circuit is formed by the parasite capacity and the resistance obtained from the high resistance layer 61. Therefore, when a sudden input of, such as a surge voltage, is applied, the surge voltage is reduced by the CR circuit to improve the protection capability of the MOS transistor to ESD.

G-4. Modified Example

The seventh preferred embodiment illustrates the method of implanting an N type impurity into the SOI layer SL at the bottom of the contact hole 5 by using the interlayer insulating film IZ as mask. With this method, it is enables to improve the ohmic property with the contact hole even in the silicide protection system utilizing a silicide protection film.

Figure 28:
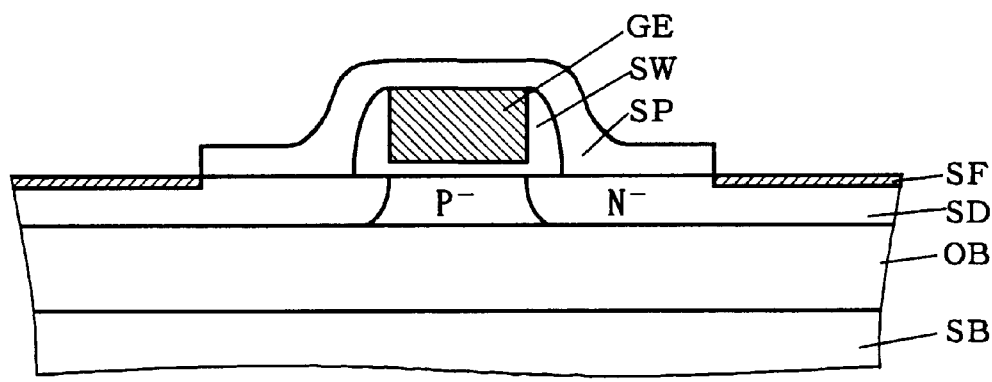
FIG. 28 is a cross-sectional view illustrating a modified processing step in manufacturing an MOS transistor of the seventh preferred embodiment.

FIG. 28 shows a construction where a silicide protection film is used. In FIG. 28, a silicide protection film SP is formed on the surfaces of a gate electrode GE, a sidewall oxide film SW, and an S/D layer SD in the vicinity of the gate electrode GE, whereas no silicide film SF is formed over the silicide protection film SP.

The feature of the above construction is that the S/D layer SD is an N⁻ layer. This enables to lower the surge voltage by increasing the resistance value of the SID layer SD. But if formed a contact hole over the silicide film SF, the ohmic property will be lowered.

Figure 29:
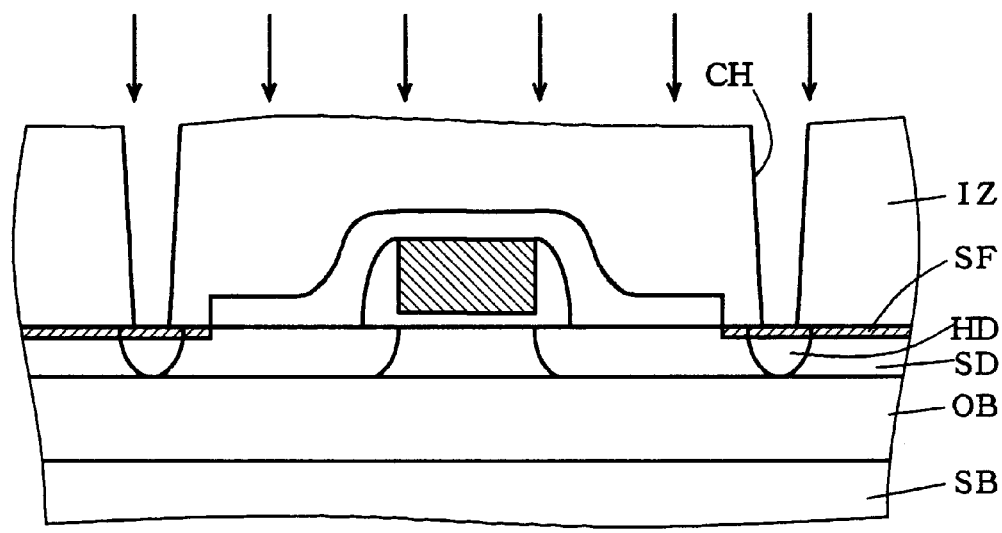
FIG. 29 is a cross-sectional view illustrating another modified processing step in manufacturing an MOS transistor of the seventh preferred embodiment.

To overcome this, after an interlayer insulating film IZ is formed and then a contact hole CH is formed as shown in FIG. 29, an N type impurity is implanted into an S/D layer SD at the bottom of a contact hole CH so that a high concentration impurity region HD is formed partially. This allows to improve the ohmic property when a conductor layer is filled in the contact hole CH.

H. Eighth Preferred Embodiment

H-1. Device Construction

The foregoing second to seventh preferred embodiments are based on the technological idea of applying the field-shield isolation structure to the silicide protection. The present inventors have developed this idea to reach the technological idea that instead of the field-shield isolation structure, a gate electrode structure is utilized in the silicide protection. A preferred embodiment based on this developed idea is described herebelow by referring to FIGS. 30 to 35.

Figure 30:
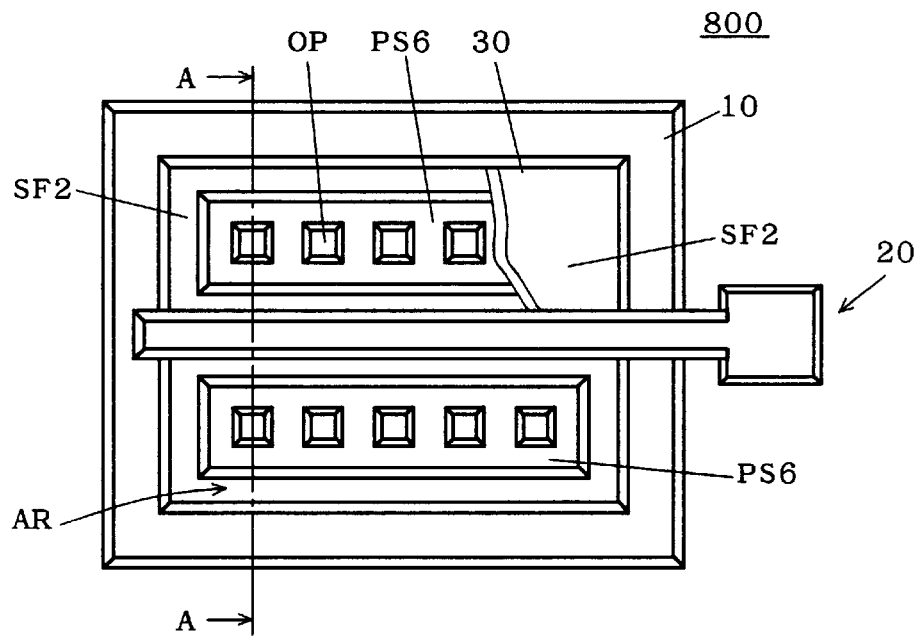
FIG. 30 is a plan view illustrating a construction of an MOS transistor according to an eighth preferred embodiment of the present invention.

FIG. 30 shows a plan construction of an MOS transistor 800 with a silicide protection structure according to an eighth preferred embodiment of the present invention.

With reference to FIG. 30, there is defined an active region AR of an MOS transistor and an FS gate electrode 10 that constitutes a field-shield isolation structure is formed in a rectangular loop shape. Over the FS gate electrode 10 and the active region AR, a gate electrode 20 of the MOS transistor is formed so as to divide the FS gate electrode 10 into two.

In the active regions AR facing with each other across the gate electrode 20, each silicide protection structure PS6 is disposed and its surrounding is an S/D layer 30. The contours of the suicide protection structures PS6 in plan view are in a slender form and are arranged in parallel in the longitudinal direction of the gate electrode 20. A plurality of opening portions OP are arranged in a row in the longitudinal direction of the silicide protection structure PS6, and the bottom faces of the opening portions OP are composed of the S/D layer 30.

The S/D layer 30 is invisible because a silicide film SF2 is formed over the layer 30 and the silicide protection structure PS6, but in FIG. 30, the silicide film SF2 and the silicide protection structure PS6 are cut in part to expose the S/D layer 30 for convenience.

H-2. Manufacturing Method

With reference to FIGS. 31 to 34 showing consecutive processing steps, a method of manufacturing an MOS transistor 800 is described herebelow. FIGS. 31 to 34 are a partial sectional view along line A—A of FIG. 30. It is noted that the MOS transistor 800 in the following description is an N channel transistor.

Figure 31:
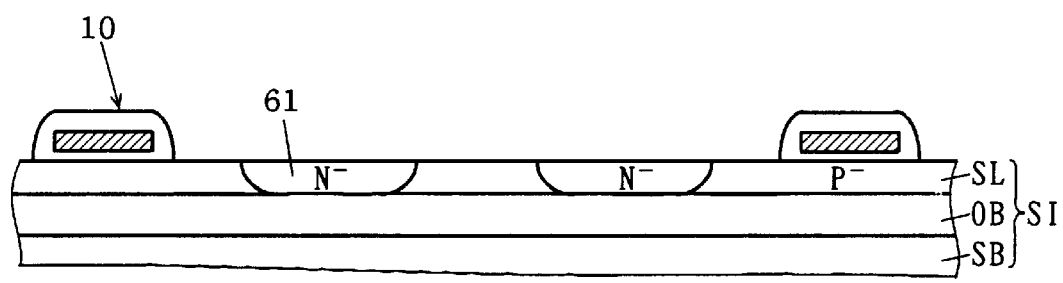
FIG. 31 is a cross-sectional view illustrating a processing step in manufacturing an MOS transistor of the eighth preferred embodiment.
Figure 32:
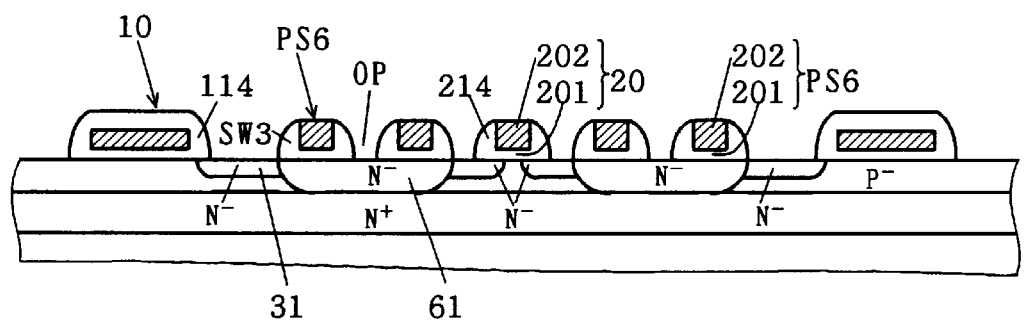
FIG. 32 is a cross-sectional view illustrating another processing step in manufacturing an MOS transistor of the eighth preferred embodiment.

Since the processing steps up to the construction shown in FIG. 31 are almost same as those of the MOS transistor 200 as described with respect to FIGS. 10 and 11, their descriptions arc omitted herein. However, it should be noted that nothing is formed over two high resistance layers 61 in the processing step shown in FIG. 31.

Then, a gate oxide film 201 and a polysilicon layer 202 are laminated in this order in the region surrounded by the two high resistance layers 61 over the SOI layer SL, thereby forming a gate electrode 20. At the same time, a suicide protection structure PS6 having the same construction as the gate electrode 20 is formed over the two high resistance layers 61. That is, the silicide protection structure PS6 is a dummy gate electrode.

Thereafter, by using an FS gate electrode 10, a sidewall oxide film 114, the silicide protection structure PS6, and the gate electrode 20, as mask, an N type impurity is implanted in a low concentration into the SOI layer SL so that a lightly doped drain layer 31 is formed in a self-aligned manner in the surface of the SOI layer SL. Then, a sidewall oxide film 214 of the gate electrode 20 and a sidewall oxide film SW3 of the silicide protection film PS6 are formed to obtain the construction shown in FIG. 32. As ion implanted, phosphorus (P) is implanted at the energy of several ten keV such that the dose is on the order of $10^{13}/cm^2$. Although in FIG. 32 two silicide protection structures PS6 are illustrated as if they were formed over a single high resistance layer 61, it should be understood to be the representation of the opening portion OP of the structure PS6.

The polysilicon layer 202 that constitutes the gate electrode 20 is formed so as to contain an N type impurity in a high concentration. For this, the CVD process may be employed while introducing an N type impurity, alternatively, an N type impurity may be implanted with an ion implantation after forming a non-doped polysilicon layer.

Figure 33:
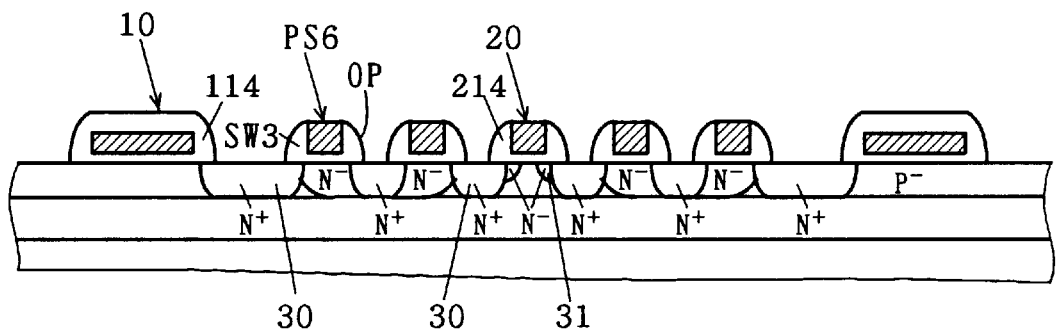
FIG. 33 is a cross-sectional view illustrating another processing step in manufacturing an MOS transistor of the eighth preferred embodiment.

With respect to FIG. 33, by using , as mask, the FS gate electrode 10, the sidewall oxide film 114, the silicide protection structure PS6, the sidewall oxide film SW3, the gate electrode 20, and the sidewall oxide film 214, an N type impurity is implanted into the SOI layer SL so that an S/D layer 30 is formed in a self-aligned manner in the surface of the SOI layer SL. As ion implanted, phosphorus (P) is implanted at the energy of several ten keV such that the dose is on the order of $10^{15}/cm^2$. As a result, the lightly doped drain layer 31 is left only beneath the sidewall oxide film 214, and an S/D layer 30 is also formed inside the high resistance layer 61 facing the opening portion OP of the silicide protection structure PS6. This S/D layer 30 serves to lower the ohmic resistance when forming a contact hole later in the process, rather than serves as an S/D layer.

Figure 34:
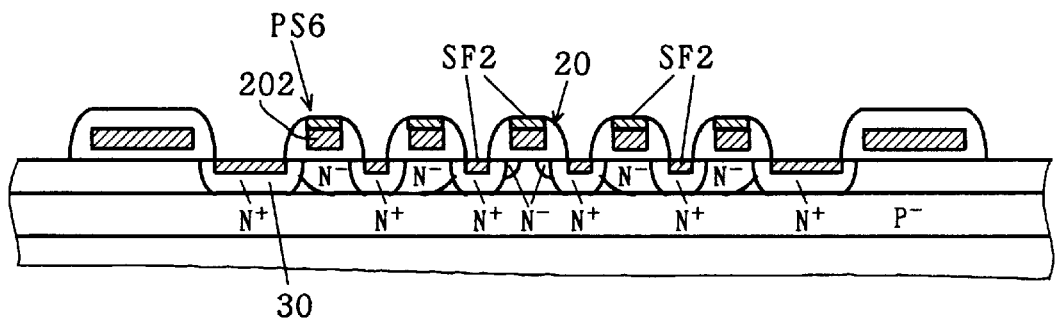
FIG. 34 is a cross-sectional view illustrating another processing step in manufacturing an MOS transistor of the eighth preferred embodiment.
Figure 35:
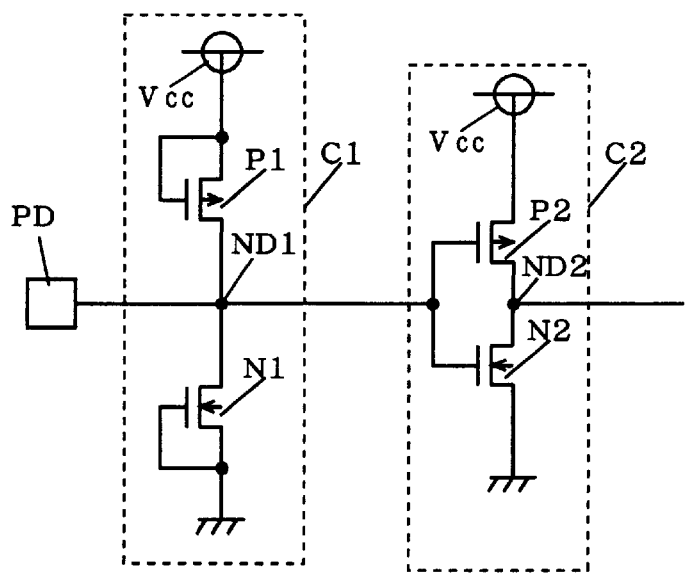
FIG. 35 is a diagram illustrating an application of a silicide protection film in prior art.
Figure 36:
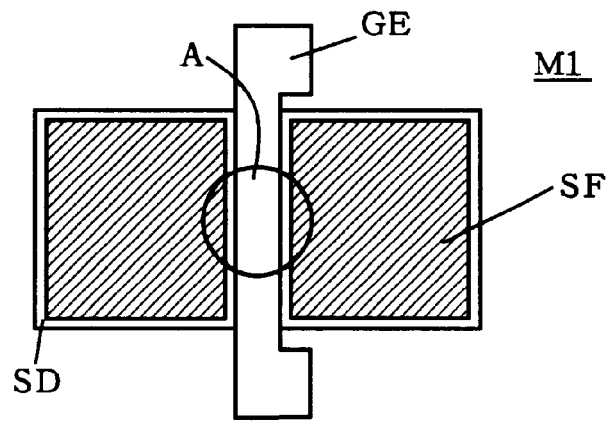
FIG. 36 is a diagram for explaining a problem of silicide film in prior art.
Figure 37:
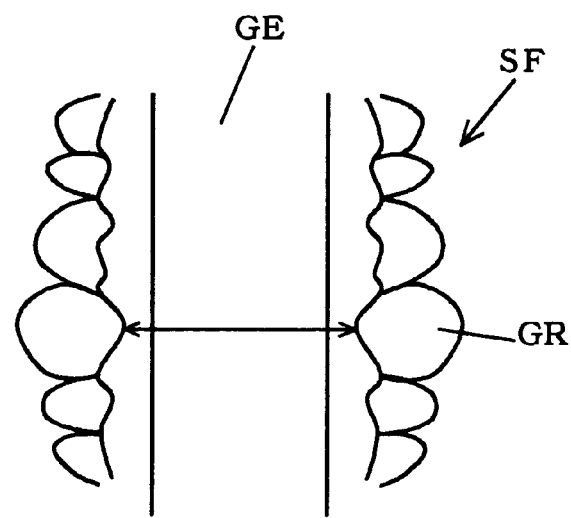
FIG. 37 is a diagram for explaining another problem of silicide film in prior art.
Figure 38:
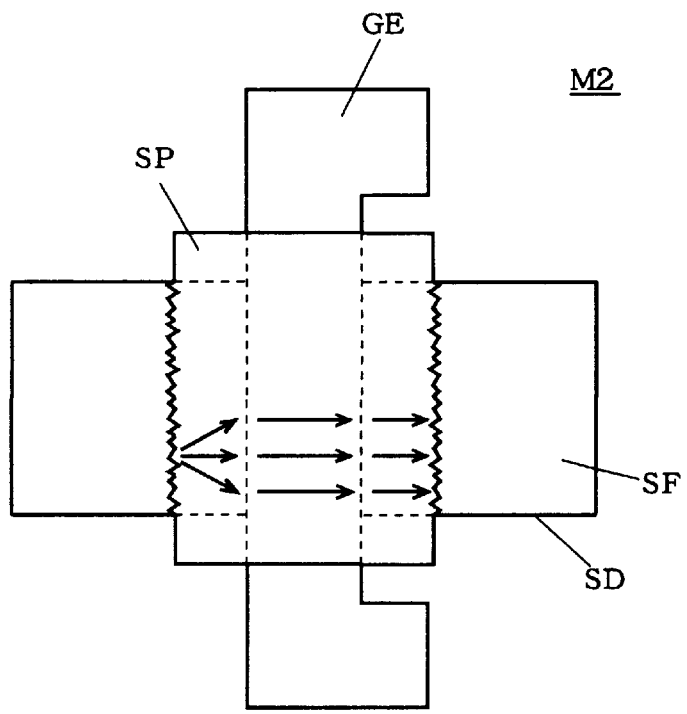
FIG. 38 is a plan view illustrating an operation of silicide protection film in prior art.
Figure 39:
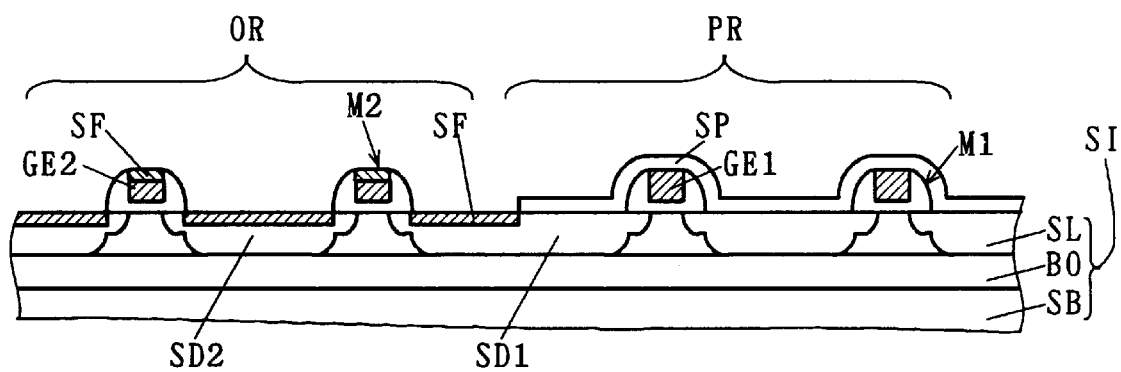
FIG. 39 is a diagram for explaining a problem of silicide protection film in prior art.
Figure 40:
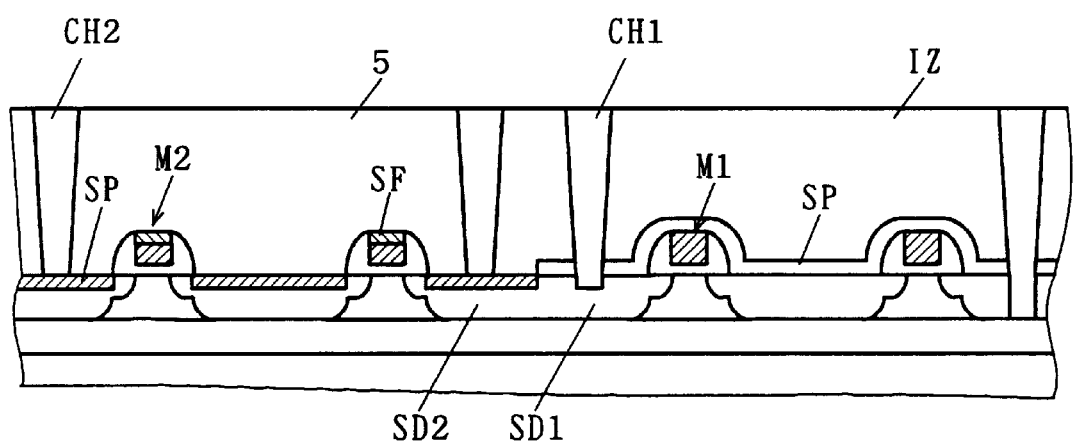
FIG. 40 is a diagram for explaining another problem of silicide protection film in prior art.

With reference to FIG. 34, with a salicide process, a suicide film SF2 is formed on the exposed face of the silicon layer, i.e., the exposed faces of the S/D layer 30 and the polysilicon layer 202, i.e., over the gate electrode 20 and over the silicide protection structure PS6.

H-3. Characteristic Effect

Thus, in the MOS transistor 800, the suicide protection structure PS6 is surrounded by the S/D layer 30 and the surrounding of the SOI layer SL beneath the structure PS6 is the high resistance layer 61. Therefore, when a surge voltage is applied between the source and drain, due to the presence of the high resistance layer 61, a voltage drop occurs to prevent the destroy of the MOS transistor 800. Additionally, since the high resistance layer 61 has a sheet resistance in k Ω unit, no large area is required and hence free from the problem of being negative toward device downsizing.

To form the silicide film SF2 over the S/D layer 30 and to form a contact hole so as to reach the opening portion of the silicide protection structure PS6 facilitate the decision of etching end, causing no over-etching of the SID layer.

Although the damage by etching cannot be ignored because SOI layers in SOI substrates are generally thin, in the eighth preferred embodiment of the present invention, the formation of the silicide protection structure is utilized in the processing step of forming the gate electrode, so that no further etching step for forming the silicide protection structure is required and thus prevents an increase in damage by etching the SOI layer.

The use of the gate electrode structure as a suicide protection structure permits a silicide protection structure formation even in semiconductor devices having no field-shield isolation structure. This leads to a wider applicability as compared to cases where the field-shield isolation structure is used as a silicide protection.

The silicide protection structure PS6 is not necessarily be in the shape as shown in FIG. 30 and it may be in the shape like the silicide protection structure PS3, PS4, or PS5, as described in the third to seventh preferred embodiments.

It should be mentioned that although the second to eighth preferred embodiments demonstrate the SOI devices formed over the SOI substrates, the present invention is not limited to SOI devices and can apply to bulk devices formed over bulk silicon substrates.

Also, though the first to eighth preferred embodiments relate to the construction that the FS gate electrode surrounds a single MOS transistor, the number of MOS transistors is not limited to one. It may be the construction that the FS gate electrode surrounds a plurality of MOS transistors arranged in parallel.

Furthermore, though the first to eighth preferred embodiments illustrate an N channel transistor, it may be a P channel transistor.

While the invention has been shown and described in detail, the foregoing description is in all aspects illustrative and not restrictive. It is therefore understood that numerous modifications and variations can be devised without departing from the scope of the invention.

We claim:

1. A semiconductor device, comprising:
a MOS transistor formed on a semiconductor substrate;
at least one silicide protection structure configured to prevent a silicide film formation in a predetermined portion on a surface of an active region outward side faces of a gate electrode;
a first semiconductor layer of a first concentration provided in a surface of said semiconductor substrate beneath said at least one silicide protection structure; and
a second semiconductor layer of a second concentration provided in a surface of said semiconductor substrate excluding a portion in which said at least one silicide protection structure is formed,
wherein said silicide film is provided on said second semiconductor layer,
said second semiconductor layer is a source/drain layer of said MOS transistor,
said first concentration is lower than said second concentration,
said at least one silicide protection structure and said gate electrode of said MOS transistor are formed simultaneously with an identical construction, and
said first semiconductor layer is a semiconductor layer having a conductivity type identical with that of said source/drain layer of said MOS transistor.

2. A semiconductor device, comprising:
a MOS transistor formed on a semiconductor substrate;
at least one silicide protection structure configured to prevent a silicide film formation in a predetermined portion on a surface of an active region outward side faces of a gate electrode;
a first semiconductor layer of a first concentration provided in a surface of said semiconductor substrate beneath said at least one silicide protection structure; and
a second semiconductor layer of a second concentration provided in a surface of said semiconductor substrate excluding a portion in which said at least one silicide protection structure is formed,
wherein said silicide film is provided on said second semiconductor layer,
said second semiconductor layer is a source/drain layer of said MOS transistor,
said first concentration is lower than said second concentration,
said at least one silicide protection structure comprises an insulating film, and
said first semiconductor layer is a semiconductor layer of a conductivity type opposite to that of said source/drain layer.

3. A semiconductor device, comprising:
a MOS transistor formed on a semiconductor substrate;
at least one silicide protection structure configured to prevent a silicide film formation in a predetermined portion on a surface of an active region outward side faces of a gate electrode;
a first semiconductor layer of a first concentration provided in a surface of said semiconductor substrate beneath said at least one silicide protection structure;
a second semiconductor layer of a second concentration provided in a surface of said semiconductor substrate excluding a portion in which said at least one silicide protection structure is formed; and
a field shield gate electrode defining said active region and electrically isolating said MOS transistor from other semiconductor elements, provided on said semiconductor substrate,
wherein said silicide film is provided on said second semiconductor layer,
said second semiconductor layer is a source/drain layer of said MOS transistor,
said first concentration is lower than said second concentration,
said field shield gate electrode has a field shield insulating film, a conductor layer, and a conductor layer upper insulating film, laminated in this order on said semiconductor substrate,
said at least one silicide protection structure and said field shield gate electrode are formed simultaneously with an identical material, and said first semiconductor layer is a semiconductor layer having a conductivity type identical with that of said source/drain layer of said MOS transistor.

4. The semiconductor device of claim 2, further comprising a field shield gate electrode defining said active region and electrically isolating said MOS transistor from other semiconductor elements, provided on said semiconductor substrate, wherein said field shield gate electrode has a field shield insulating film, a conductor layer, and a conductor layer upper insulating film, laminated in this order on said semiconductor substrate;

a sidewall insulating film is provided on side faces of said field shield insulating film, said conductor layer, and said conductor layer upper insulating film; and said insulating film of said at least one silicide protection structure and said sidewall insulating film are formed simultaneously with an identical material.

5. The semiconductor device of claim 1, wherein:

said at least one silicide protection structure partially includes at least one opening portion having a bottom composed of said silicide film; and said second semiconductor layer is provided in a surface of said active region beneath said silicide film of said at least one opening portion.

6. The semiconductor device of claim 5, wherein:

said at least one silicide protection structure has a slender shape in plan view;

said at least one opening portion comprises a plurality of opening portions arranged in a row in a longitudinal direction of said at least one silicide protection structure; and a longitudinal direction of said at least one silicide protection structure is parallel to a longitudinal direction of said gate electrode.

7. The semiconductor device of claim 6, wherein:

said at least one silicide protection structure comprises a plurality of silicide protection structures; and said plurality of silicide protection structures are arranged at an interval so that they are in parallel to a longitudinal direction of said gate electrode.

8. The semiconductor device of claim 5, wherein:

said at least one suicide protection structure comprises a plurality of silicide protection structures each having an approximately rectangular shape in plan view;

said at least one opening portion consists of a single opening portion; and said plurality of silicide protection structures are arranged at least in parallel to a longitudinal direction of said gate electrode.

9. The semiconductor device of claim 8, wherein said plurality of silicide protection structures are arranged in a longitudinal direction of said gate electrode and in a direction vertical to said longitudinal direction of said gate electrode.

10. The semiconductor device of claim 5, wherein:

said at least one silicide protection structure has an approximately rectangular shape in plan view;

said at least one opening portion comprises a plurality of opening portions; and said plurality of opening portions are arranged in a direction parallel to a longitudinal direction of said gate electrode and in a direction vertical to said longitudinal direction of said gate electrode.

* * * * *